United States Patent [19]
Abraham

[11] Patent Number: 5,818,127
[45] Date of Patent: Oct. 6, 1998

[54] TRANSMISSION OF FM VIDEO SIGNALS OVER VARIOUS LINES

[75] Inventor: Charles Abraham, Evington, Va.

[73] Assignee: Videocom, Inc., Evington, Va.

[21] Appl. No.: 884,171

[22] Filed: Jun. 27, 1997

Related U.S. Application Data

[63] Continuation-in-part of Ser. No. 718,726, Sep. 24, 1996, abandoned, and a continuation-in-part of Ser. No. 270,002, Jul. 1, 1994, Pat. No. 5,559,377, which is a continuation-in-part of Ser. No. 822,329, Jan. 17, 1992, abandoned, which is a continuation of Ser. No. 515,578, Apr. 26, 1990, abandoned, which is a continuation-in-part of Ser. No. 429,208, Oct. 30, 1989, abandoned, which is a continuation-in-part of Ser. No. 344,907, Apr. 28, 1989, abandoned.

[60] Provisional application Nos. 60/007,490 Nov. 22, 1995 and 60/009,314 Dec. 29, 1995.

[51] Int. Cl.[6] ..................................... H04B 1/04
[52] U.S. Cl. ................... 307/106; 347/850; 340/310.07; 455/280; 455/75; 327/233
[58] Field of Search ..................................... 307/104, 106; 330/149; 343/850; 455/75, 280; 348/12; 340/310.07; 327/233; 386/13, 85

[56] References Cited

U.S. PATENT DOCUMENTS

| | | |
|---|---|---|
| 4,066,912 | 1/1978 | Wetherell . |
| 4,308,620 | 12/1981 | Grousseau ................................ 455/75 |
| 4,323,882 | 4/1982 | Gajjar . |
| 4,449,128 | 5/1984 | Weir ........................................ 455/113 |
| 4,549,178 | 10/1985 | Lester . |
| 4,567,511 | 1/1986 | Smith et al. . |
| 4,723,115 | 2/1988 | Apter . |
| 4,968,968 | 11/1990 | Taylor ..................................... 342/174 |
| 5,036,386 | 7/1991 | Yasumoto et al. ...................... 348/432 |
| 5,066,939 | 11/1991 | Mansfield, Jr. . |
| 5,136,455 | 8/1992 | Billingsley . |
| 5,327,316 | 7/1994 | Yi . |
| 5,424,587 | 6/1995 | Federowicz . |
| 5,621,455 | 4/1997 | Rogers et al. ............................ 348/12 |

*Primary Examiner*—Jeffrey A. Gaffin
*Assistant Examiner*—Albert W. Paladini
*Attorney, Agent, or Firm*—Panitch Schwarze Jacobs & Nadel, P.C.

[57] ABSTRACT

An apparatus for electrical line communications using FM video modulation, includes FM video modulation circuits and an impedance matching coupler at each of two or more locations along a pair of lines. The impedance matching couplers provide impedance matching, utilizing an air-core preselected frequency bands, sufficient to allow low-loss transmission of frequency modulated video signals. The coupler further eliminates noise and is matched resistively to the characteristic impedance of the line at the preselected frequency bands. A transmitter, receiver and associated circuits may also be provided at each location along the lines. The FM video modulation circuits, in combination with phase linear coupling techniques, provide for hi-fidelity video transmission over existing electrical lines, such as residential AC power wiring. In addition, a coupler with solid state impedance matching is provided.

45 Claims, 20 Drawing Sheets

FIGURE 9

TRANSMISSION OF FM VIDEO SIGNALS OVER VARIOUS LINES

CROSS-REFERENCE TO RELATED APPLICATIONS

This application is a continuation-in-part of U.S. patent application Ser. No. 08/718,726 filed Sep. 24, 1996, which claims the benefit of Provisional Application No. 60/007,490 filed Nov. 22, 1995 and Provisional Application No. 60/009,314 filed Dec. 29, 1995, and is a continuation-in-part of U.S. patent application Ser. No. 08/270,002 filed Jul. 1, 1994, now U.S. Pat. No. 5,559,377, which is a continuation-in-part of Ser. No. 822,329 filed Jan. 17, 1992, now abandoned, which is a continuation of Ser. No. 515,578 filed Apr. 26, 1990, now abandoned, which is a continuation-in-part of Ser. No. 429,208 filed Oct. 30, 1989, now abandoned, which is a continuation-in-part of Ser. No. 344,907, filed Apr. 28, 1989, now abandoned.

BACKGROUND OF THE INVENTION

The present invention relates generally to power system communications, and more particularly to a communications system used to transmit frequency modulated video (FM) data signals over various types of power lines, including AC, DC, coaxial cables, and telephone lines.

Current communications systems for voice, video and/or data (VVD) signals, such as cable television and ISDN telephone services require the installation of a particular wiring scheme and wire type throughout a facility, such as a home, apartment building, or office building. Typically, cable television and video transmissions use coaxial cable wiring, telephones use bundled telephone wire and PBX telephone systems use twisted pair wiring. For many older buildings, such a wiring scheme may be difficult to implement. For instance, it may require fishing wires through walls and under floors. Such retrofitting is thus often difficult and expensive.

Although such facilities may not be wired with advanced communications wiring, such facilities are wired for transmitting AC electrical current throughout the facility for powering appliances and light fixtures. Accordingly, it would be advantageous to be able to transmit VVD signals over pre-existing power lines in a facility.

"Power-line carriers" are well known in the field of power system communications. The principal elements of such power-line carriers are transmitting and receiving terminals, which include one or more line traps, one or more coupling capacitors, as well as tuning and coupling equipment. Detailed information regarding the description and typical composition of conventional power line carriers may be found in *Fundamentals Handbook of Electrical and Computer Engineering, Volume II: Communication, Control, Devices, and Systems*, John Wiley & Sons, 1983, pp 617–627, and in U.S. Pat. No. 5,559,377, the contents of each being incorporated herein by reference.

Traditional couplers incorporate a ferrite or iron core transformer which causes signal distortion due to the non-linear phase characteristic of the transfer function between the transmit coupler and the receive coupler. The distortion is created by the presence of magnetic core material which exhibits hysteresis. For distribution power-line carriers, the distortion is particularly severe because the signal must propagate through three such non-linear devices, the distribution transformer and two power-line couplers, which use ferrite core transformers. The distortion leads to envelope delay distortion which limits communication speeds.

The major shortcoming of previous designs resulted from the use of such ferrite or iron core transformers in the signal couplers. The inductance of the transformer is altered to some unknown value due to the non-linearity of the transformer core. This results in a mistuning of the desired carrier frequency. Also, the impedance of the primary winding at the desired carrier frequency is no longer purely resistive, which leads to a mismatch with respect to the line characteristic impedance.

The prior art designs, in recognition of these facts, attempt to couple the data signal onto the power line with a low transceiver input impedance by using a large coupling capacitor (e.g., approx. 0.5 uF). The draw back with this approach is that there is a significant coupling loss of up to 20 dB at carrier frequency. Such signal distortion makes it nearly impossible to use power lines for transmission of high bandwidth frequency modulated (FM) digital video data signals. Thus, prior art systems which attempt to transmit video data signals over a power line used AM transmission techniques.

However, it is very difficult to maintain a high signal to noise ratio (40 dB or higher) required at every outlet, as required for clear AM transmission, when transmitting over power lines. In addition, there are several interfering signals below 15 MHZ in the air which are picked up by the power lines. Between 15–30 MHZ there is little or no interference, besides CB stations, which are usually about 27–28 MHZ. FM video uses a band from 18–27 MHZ with a bandwidth of about 5 MHZ.

It is well known that FM signal transmission generally maintains signal integrity better than other signal transmission techniques, such as amplitude modulation (AM). That is, FM signals are less sensitive to noise. In addition, if a selected bandwidth is too noisy, the carrier frequency can easily be moved to another, less noisy channel. Thus, in order to provide high quality, high-definition VVD signal, it would be advantageous to be able to use FM transmission techniques.

The present invention provides a power line communications system which is capable of transmitting FM video data signals over power lines, including both high and low voltage AC and DC lines, coaxial cable and twisted pair lines such that communications equipment, such as televisions, telephones, facsimile machines and computers may be connected to preexisting electrical outlets and receive VVD signals over preexisting electrical wiring. In addition, such connected devices may also transmit VVD signals over the same wiring.

SUMMARY OF THE INVENTION

Briefly, the present invention is a communications apparatus for communicating frequency modulated (FM) video signals through an electrical line having a characteristic impedance. The apparatus comprises:

a first FM modulator for frequency modulating the FM video signals to produce a modulated carrier signal having a first preselected frequency;

a first transmitter having an output impedance, connected to the first FM modulator, for transmitting the modulated carrier signal; and a first coupler connected between the electrical line and the first transmitter for matching the output impedance of the first transmitter to the characteristic impedance of the electrical line, wherein the first coupler comprises linear phase means for communicating the modulated carrier signal to the electrical line without significant phase distortion.

The present invention also provides a communications apparatus for a vehicle for communicating frequency modulated (FM) video signals through an electrical line of the vehicle, the electrical line for transmitting an electrical current from a first point of the vehicle to a second point of the vehicle for powering a load connected to the electrical line proximate to the second point. The apparatus comprises:

a modulator for frequency modulating the FM video signals to produce a modulated carrier signal having a first preselected frequency;

a transmitter having an output impedance, connected to the modulator, for transmitting the modulated carrier signal from the first point to the second point over the electrical line; and a first coupler connected between the electrical line and the transmitter for matching the output impedance of the transmitter to a characteristic impedance of the electrical line, wherein the first coupler comprises linear phase means for communicating the modulated carrier signal to the electrical line without significant phase distortion.

The present invention further provides a system for transmitting frequency modulated (FM) video signals over electrical lines, the electrical lines generally provided for delivering electricity to a plurality of electrical outlets, wherein a first video display device is electrically connected to one of the plurality of electrical outlets. The system comprises a first FM transmitter subsystem comprising:

a first FM modulator connected to the video display device for receiving video signals therefrom and for frequency modulating the video signals to produce a modulated carrier signal having a first preselected frequency;

a first transmitter having an output impedance, connected to the first FM modulator, for transmitting the modulated carrier signal; and a first coupler connected between the electrical line and the first transmitter for matching the output impedance of the first transmitter to a characteristic impedance of the electrical line, wherein the first coupler comprises linear phase means for communicating the modulated carrier signal to the electrical line without significant phase distortion.

The present invention also provides a communications apparatus for communicating modulated baseband video signals through an electrical line having a characteristic impedance, the apparatus comprising a first modulator for modulating the baseband video data to produce a modulated carrier signal having a first preselected frequency and a first transmitter having an output impedance, connected to the first modulator, for transmitting the modulated carrier signal.

The present invention also provides a communications apparatus for communicating modulated S-video signals through an electrical line having a characteristic impedance, the apparatus comprising a first modulator for modulating the S-video signals to produce a modulated carrier signal having a first preselected frequency; and a first transmitter having an output impedance, connected to the first modulator, for transmitting the modulated carrier signal.

The present invention also provides a communications apparatus for communicating frequency modulated (FM) baseband video signals through an electrical line having a characteristic impedance, the apparatus comprising a first FM modulator for frequency modulating the baseband video data to produce a frequency modulated carrier signal having a first preselected frequency; and a first transmitter having an output impedance, connected to the first FM modulator, for transmitting the modulated carrier signal.

The present invention also provides a communications apparatus for communicating frequency modulated (FM) S-video signals through an electrical line having a characteristic impedance, the apparatus comprising: a first FM modulator for frequency modulating the S-video signals to produce a frequency modulated carrier signal having a first preselected frequency; and a first transmitter having an output impedance, connected to the first FM modulator, for transmitting the modulated carrier signal.

The present invention also provides a communications apparatus for communicating frequency modulated (FM) video signals through an electrical line having a characteristic impedance, the apparatus comprising:

a first FM modulator for frequency modulating the video data to produce a frequency modulated carrier signal having a first preselected frequency;

a first transmitter having an output impedance, connected to the first FM modulator, for transmitting the modulated carrier signal;

a first receiver having an input impedance for receiving the modulated carrier signal;

a first FM demodulator electrically connected to the first receiver for demodulating the received modulated carrier signal to produce a demodulated carrier signal having a second preselected frequency; and a wireless remote-control (R/C) transmitter for transmitting data signals to the first receiver.

The present invention further provides a communications apparatus for communicating MPEG I modulated signals through an electrical line having a characteristic impedance, the apparatus comprising: a signal processor for converting video data to MPEG I video data; a first modulator for modulating the MPEG I video data to produce a modulated carrier signal having a first preselected frequency; and a first transmitter having an output impedance, connected to the first modulator, for transmitting the modulated carrier signal.

The present invention also provides a communications apparatus for communicating MPEG II modulated signals through an electrical line having a characteristic impedance, the apparatus comprising: a signal processor for converting video data to MPEG II video data; a first modulator for modulating the MPEG II video data to produce a modulated carrier signal having a first preselected frequency; and a first transmitter having an output impedance, connected to the first modulator, for transmitting the modulated carrier signal.

The present invention also provides a communications apparatus for communicating frequency modulated stereo audio signals through an electrical line, the apparatus comprising a first modulator for modulating the stereo audio signals to produce a modulated carrier signal having a first preselected frequency, and a first transmitter having an output impedance, connected to the first modulator, for transmitting the modulated carrier signal.

BRIEF DESCRIPTION OF THE SEVERAL VIEWS OF THE DRAWING

The foregoing summary, as well as the following detailed description of the presently preferred embodiments of the invention will be better understood when read in conjunction with the appended drawings. For the purpose of illustrating the invention, there are shown in the drawings embodiments which are presently preferred. It should be understood, however, that the present invention is not limited to the particular arrangement and instrumentalities shown. In the drawings:

FIG. 9 is a more detailed electrical schematic diagram of a 5 MHZ and 6 MHZ FM audio demodulator of the FM receiver system FIG. 6;

DETAILED DESCRIPTION OF THE INVENTION

Figure 1:
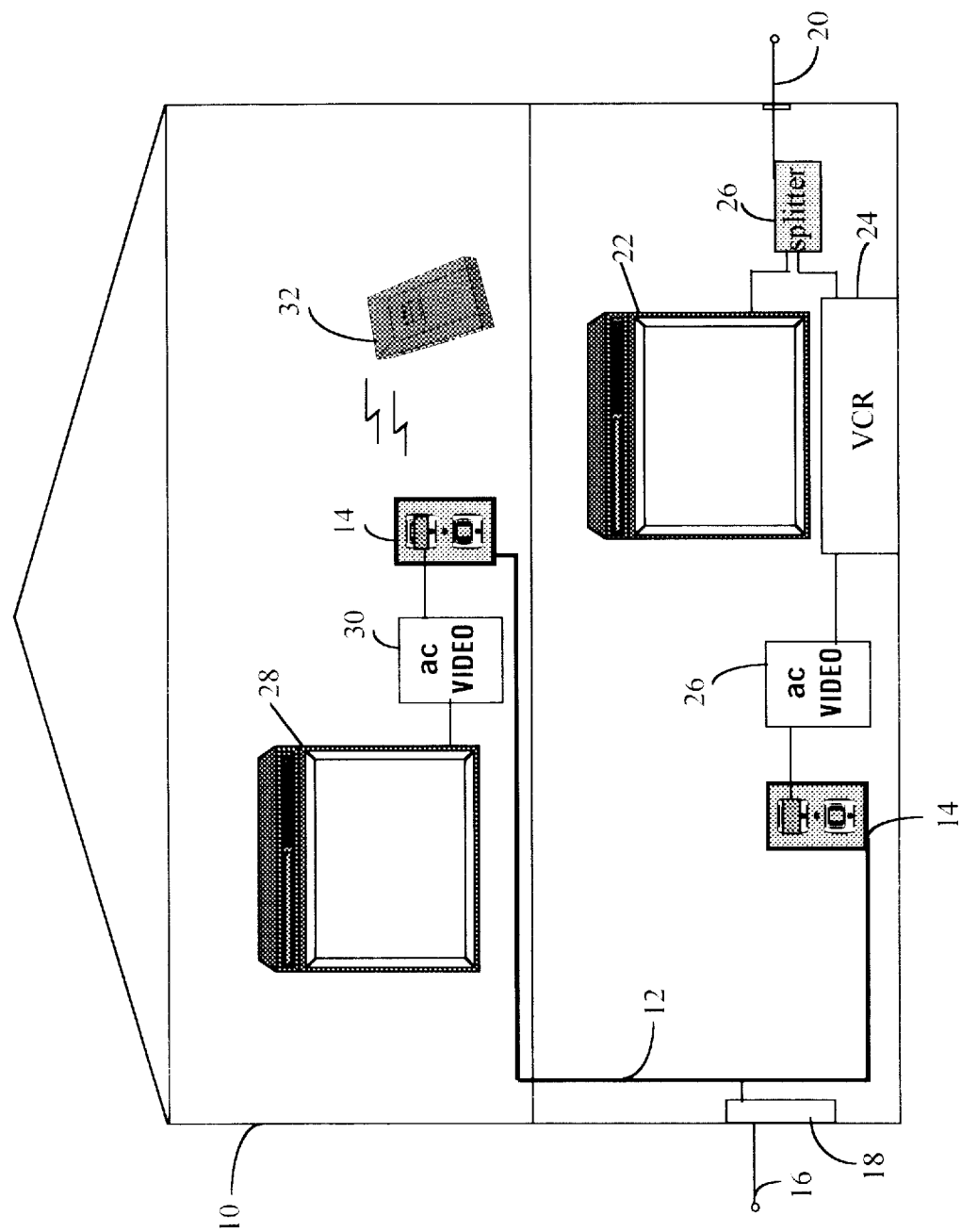
FIG. 1 is a schematic diagram of a communications system located in a building for transmitting FM video signals through an electrical line in accordance with the present invention.

Certain terminology is used in the following description for convenience only and is not limiting. For instance, video data signals generally means both voice and audio data signals, unless otherwise specified. The terminology includes the word above, specifically mentioned, derivatives thereof and words of similar import. In the drawings, like numerals are used for like elements throughout.

The communications apparatus of the present invention has numerous applications, such as for connecting a plurality of display devices to a CATV line using existing electrical lines. The present invention can be further utilized to transmit FM video data from a remote camera located in a vehicle, such as at a rear end of a vehicle, to a control station which is spaced from the camera, using existing vehicle electrical lines. That is, the present invention makes it possible to transmit electricity and video data signals over power lines simultaneously. Such video data signals can be transmitted at low power and high data rates over long distances and directly through power line transformers. For instance, the video data may travel over electrical lines provided by the electric company to any homes connected to the electric company lines. That is, the data signals travel on home 120/240/480 Volt lines and distribution 13,800/22,000/69,000 Volt lines and through all associated distribution transformers.

Referring to FIG. 1, a building, such as a house 10 is shown having AC electrical wiring 12. The AC electrical wiring 12 is entirely conventional and as is well known, includes a characteristic impedance. The AC electrical wiring 12 distributes electrical power to a plurality of conventional electrical sockets or outlets 14 located throughout the house 10. In the United States, the wiring is commonly 120 V, and is sourced from an outside power distribution system 16 and enters the house 10 through a fuse or circuit breaker box 18. The house 10 is also provided with a communications line, such as a coaxial cable 20, for receiving a video broadcast signal from a cable television services operator. A display device such as a television 22 or a VCR 24 may be connected to the coaxial cable 20 in a known manner in order to receive the broadcast signal.

According to the present invention, the broadcast signal may be transmitted to additional display devices throughout the house 10 over the AC electrical wiring 12. In order to provide a high quality (DSS quality) picture over the electrical wiring 12, the present invention transmits video data using FM techniques. In the exemplary configuration shown in FIG. 1, the coaxial cable 20 is connected to a splitter 26 having a first output line connected to the television 22 and a second output line connected to the VCR 24. The VCR 24 is then connected to the electrical wiring 12 at one of the outlets 14. In order to transmit the broadcast signal over the electrical wiring 12, a first communications apparatus 26 is connected between the VCR 24 and the outlet 14. In the presently preferred embodiment, the baseband output of the VCR 24 is connected to the first communications apparatus 26. Alternatively, if the cable 20 is connected to a converter box (not shown), then the baseband output of the converter box is connected to the first communications apparatus 26. Although it is preferred to use the baseband output of a television or VCR, it will be understood by those of ordinary skill in the art that alternatively, the RF output of the television or VCR could be used.

The first communications apparatus 26 frequency modulates the video signals to produce an FM carrier signal having a first preselected frequency and transmits the FM carrier signal over the electrical wiring 12. The use of FM, as opposed to other modulation techniques, such as AM, is believed to be advantageous because FM has been found to be able to maintain a signal-to-noise ratio (SNR) of 40 dB or higher. For instance, it has been found that an AM based communications system for transmitting video data over the power line cannot maintain in every outlet a 40 dB or higher (SNR). The first communications apparatus 26 further matches its output impedance to the characteristic impedance of the electrical line 12 so that the FM carrier signal is transmitted over the electrical line 12 without significant phase distortion.

A second display device, such as a second television 28 is connected to the electrical wiring 12 via another outlet 14 and receives electrical power therefrom. In order to view the broadcast signal at the second television 28, rather than connecting the second television 28 directly to the coaxial cable 20, a second communications apparatus 30 is connected between the second television 28 and the outlet 14. The second communications apparatus 30 receives the FM carrier signal transmitted over the electrical wiring 12, in addition to receiving electrical power. The second communications apparatus 28 demodulates the received FM carrier signal and produces a demodulated carrier signal, which is provided to the second television 28. The second television 28 then tunes a channel selected for viewing in a conventional manner. Alternatively, the second television may tune a channel through the VCR 24. For instance, a wireless or infrared remote-control (R/C) transmitter 32 may be used to transmit data signals to the VCR 24 using the first and second communications apparatus 26, 30 and the electrical wiring 12. That is, as will be discussed in more detail below, the second communications apparatus 30 includes an R/C receiver circuit for receiving data signals transmitted from the R/C transmitter 32 and an FM modulator for modulating the R/C transmitter data signals and generating a carrier signal therefor. The modulated data signals are then transmitted over the electrical wiring 12 to the first communications apparatus 26 and to the VCR 24. Preferably, the FM video data is transmitted at a frequency band between about 15 and 27 MHZ, the FM audio data is transmitted at a frequency band between about 28–30 MHZ, and the IR R/C data is transmitted with about a 450 Hz carrier frequency.

Figure 2A:
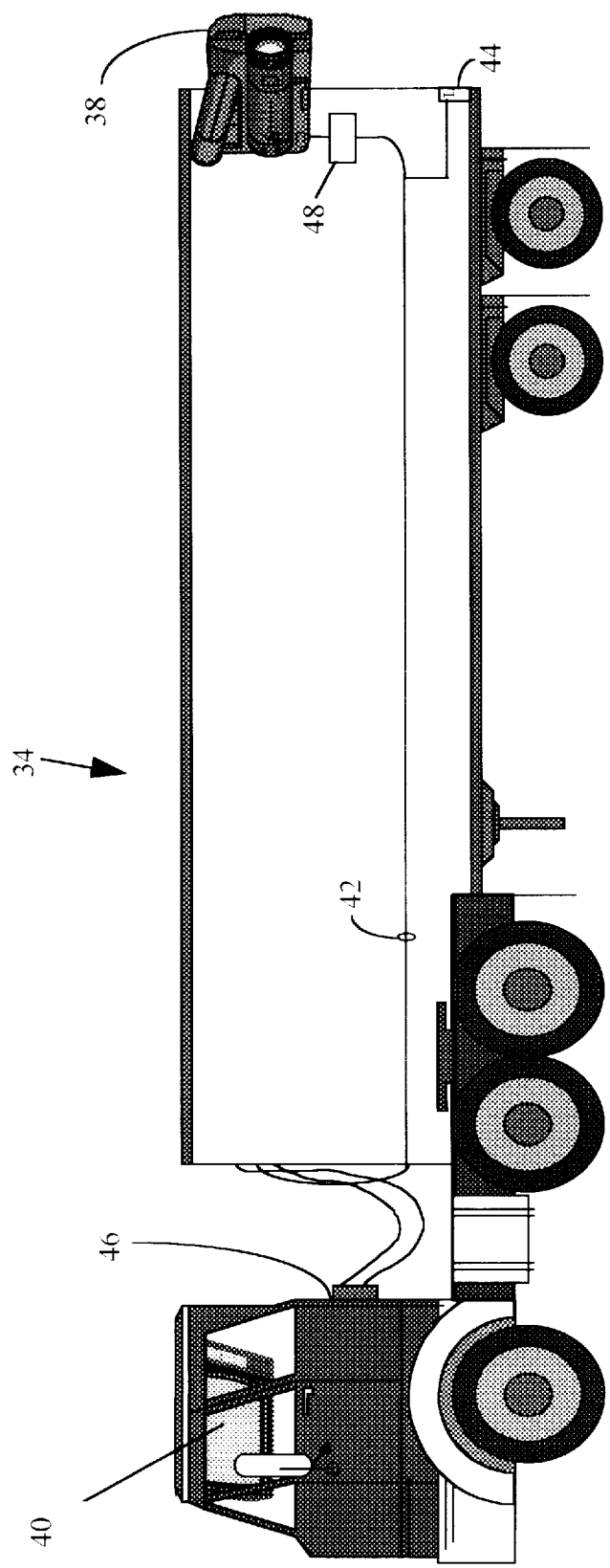
FIG. 2A illustrates the communications apparatus of FIG. 1 in an automotive vehicle.
Figure 2B:
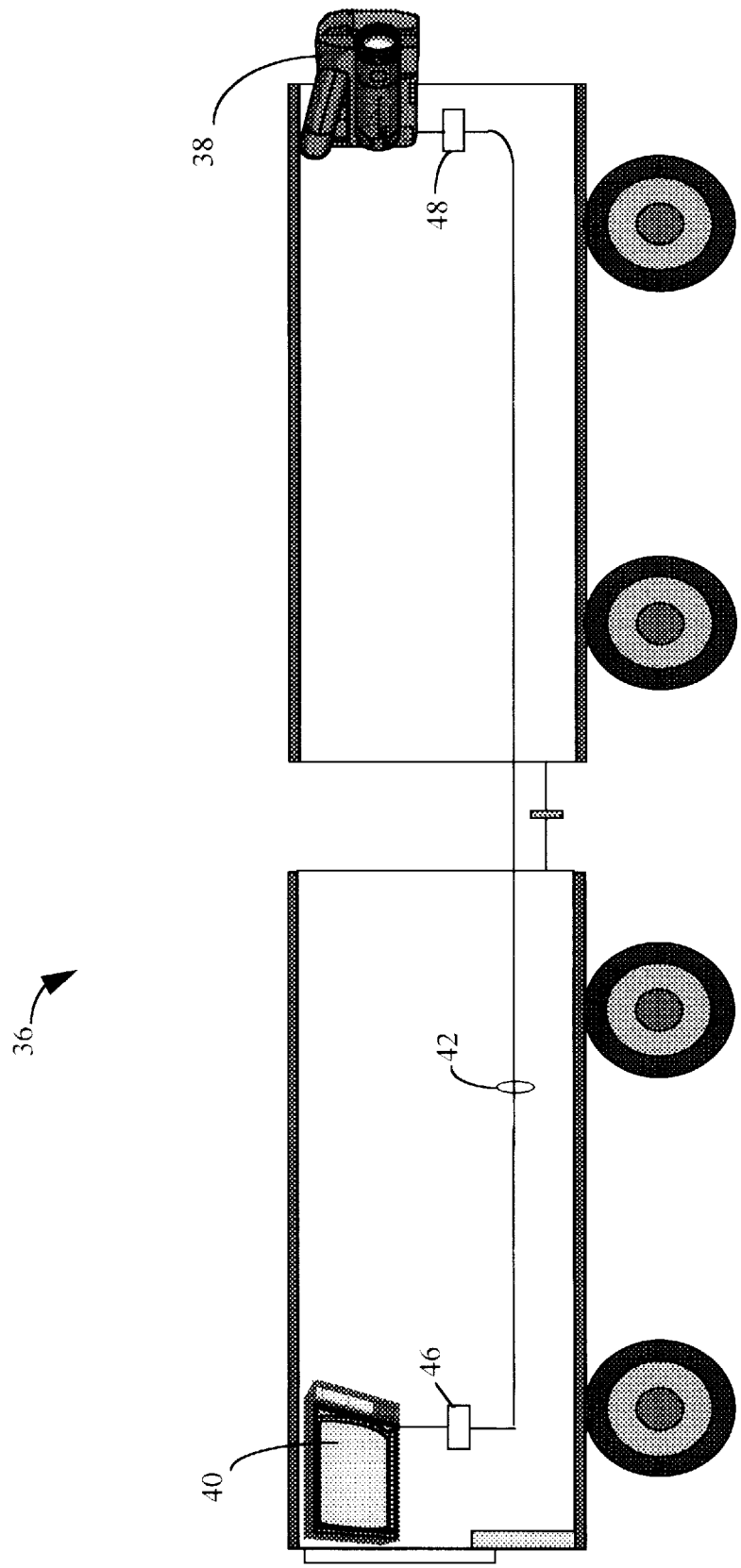
FIG. 2B illustrates the communications apparatus of FIG. 1 in a train.

The communications system of the present invention can also be used in connection with vehicles, such as automobiles, trucks, busses, trains, airplanes, boats, ships, submarines, and the like. For instance, a video camera can be mounted in a first location of the vehicle, such as in the rear of the vehicle, and the video data can be transmitted over existing electrical wiring to a monitor located in a second location of the vehicle, such as in the front of the vehicle at the operator control station. FIG. 2A shows a communications system in use on a tractor-trailer type truck 34 and FIG. 2B shows the communications system in use on a train 36. In both FIGS. 2A and 2B, the communications system is used to connect a video camera 38 to a display monitor 40 using existing electrical wiring 42. On the truck 34, the wiring 42 is typically a 12 volt line and is used to provide power to electrical loads, such as rear brake lights 44, while on the train 36, the electrical wiring 42 may carry a much larger voltage, such as 74 volts. However, according to the present invention, video data signals can be transmitted over any electrical lines. Typically, a first communications apparatus 46 connects the monitor 40 to the electrical wiring 42 and a second communications apparatus 48 connects the video camera 38 to the electrical wiring 42. The first and second communications apparatus 46, 48 transmit and receive data, frequency modulate and demodulate the data, and match the characteristic impedance of the electrical wiring 42, in order to provide high quality data signal transmission.

Figure 3:
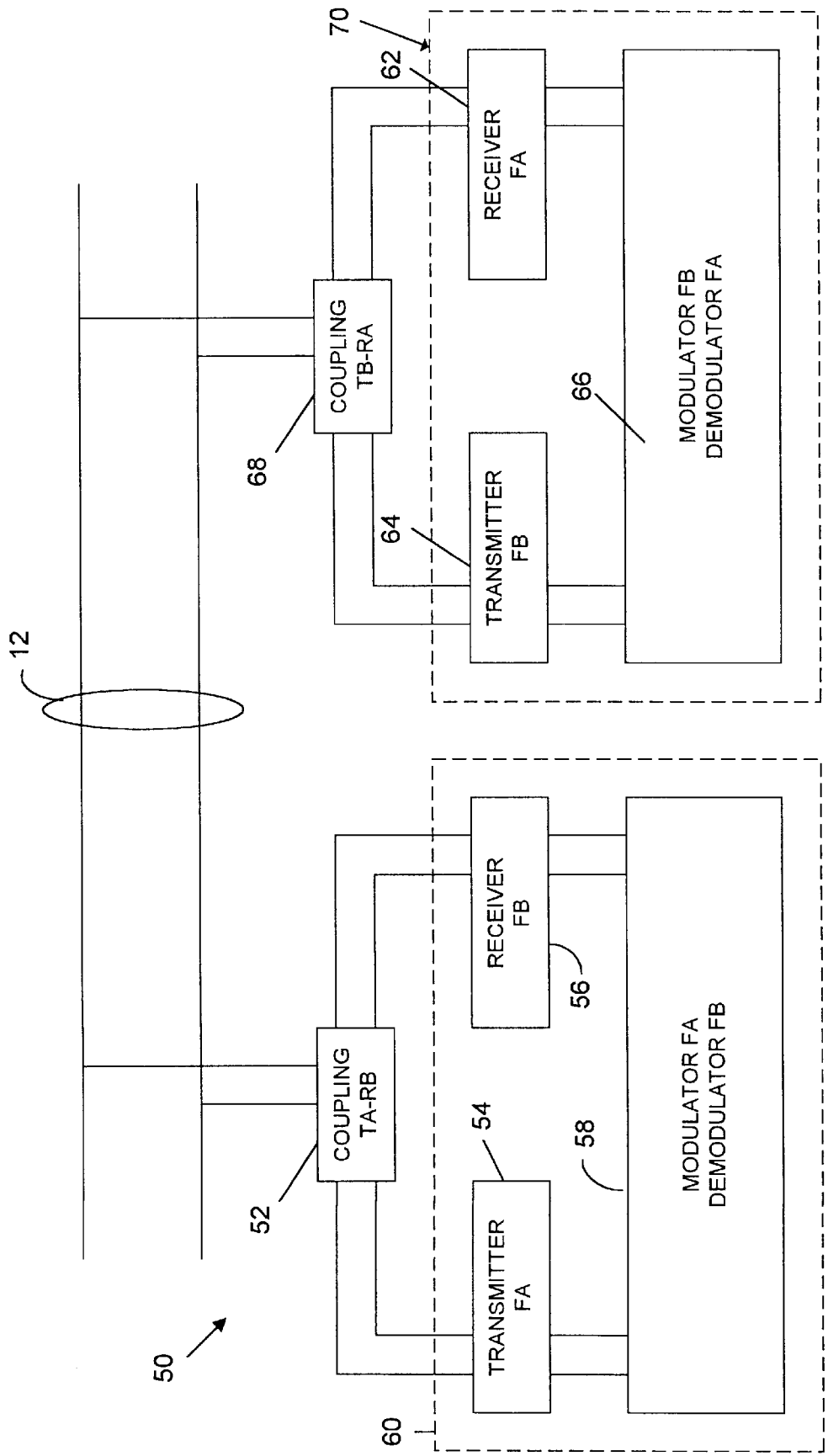
FIG. 3 is a schematic block diagram of a powerline communication apparatus for transmitting FM video signals through an electrical line in accordance with the present invention.

Referring now to FIG. 3, a block diagram of a power-line communication apparatus 50 according to the present invention for use in low power applications (up to 480 VAC) is shown. The communications apparatus 50 shown is coupled to a conventional electrical wiring 12. The communications apparatus 50 generally comprises a first coupler 52, a first transmitter 54, a first receiver 56, and a first FM modulator 58. The first transmitter 54, first receiver 56, and first FM modulator 58 comprise a first modem 60.

The first transmitter 54, having an output impedance, is coupled to the first coupler 52, and is capable of transmitting digital data signals carried by a first FM carrier frequency FA over the electrical wiring 12. The first receiver 56, having an input impedance, is coupled to the first coupler 52, and is capable of receiving digital data signals carried by a second FM carrier frequency FB over the electrical wiring 12. The first FM modulator 58 is connected to both the first transmitter 54 and the first receiver 56. The FM modulator 58 frequency modulates the digital video data signals carried by the first carrier frequency FA, and demodulates the digital video data signals carried by the second carrier frequency FB. The first coupler 52 is connected between the electrical wiring 12 and the first transmitter 54 for matching the output impedance of the first transmitter 54 to the characteristic impedance of the electrical wiring 12. The first coupler 52 is also connected between the electrical wiring 12 and the first receiver 56 for matching the input impedance of the first receiver 56 to the characteristic impedance of the electrical wiring 12. In order to communicate the FM carrier signal to the electrical line 12 without significant phase distortion, the first coupler 52 comprises linear phase means. As discussed in greater detail in relation to FIG. 5, the linear phase means comprises a transformer.

The communications apparatus 50 further comprises, at a second location along the electrical wiring 12, a second receiver 62, a second transmitter 64, an FM demodulator 66, and a second coupler 68. The combination of the second receiver 62, the second transmitter 64 and the FM demodulator 66 comprises a second modem 70.

The FM demodulator 66 is connected to both the second transmitter 64 and the second receiver 62. The second receiver 62, having an input impedance, receives the FM carrier signal transmitted over the electrical wiring 12 by the first transmitter 54 at the first preselected carrier frequency FA. The FM demodulator 66 demodulates the received FM carrier signal FA to produce a demodulated carrier signal. The second transmitter 64 is capable of transmitting the digital data signals at the second FM carrier frequency FB over the electrical wiring 12. The second coupler 68 is connected between the electrical wiring 12 and the second receiver 62 for matching the input impedance of the second receiver 62 to the characteristic impedance of the electrical wiring 12. The second coupler 68 is also connected between the second transmitter 64 and the electrical wiring 12 and matches the output impedance of the second transmitter 64 to the characteristic impedance of the electrical wiring 12. Like the first coupler 52, the second coupler 68 comprises linear phase means for communicating the FM carrier signal to the second receiver 62 without significant phase distortion. The FM demodulator 66 can also modulate digital data signals at the second carrier frequency FB for transmission over the electrical wiring 12 by way of the second transmitter 64 and the second coupler 68.

As previously discussed, the first and second carrier frequencies FA, FB preferably comprise frequencies up to about 30 MHZ, and more preferably, between about 15 MHZ and about 30 MHZ, although the present invention can use a higher than 30 MHZ carrier frequency.

Figure 5:
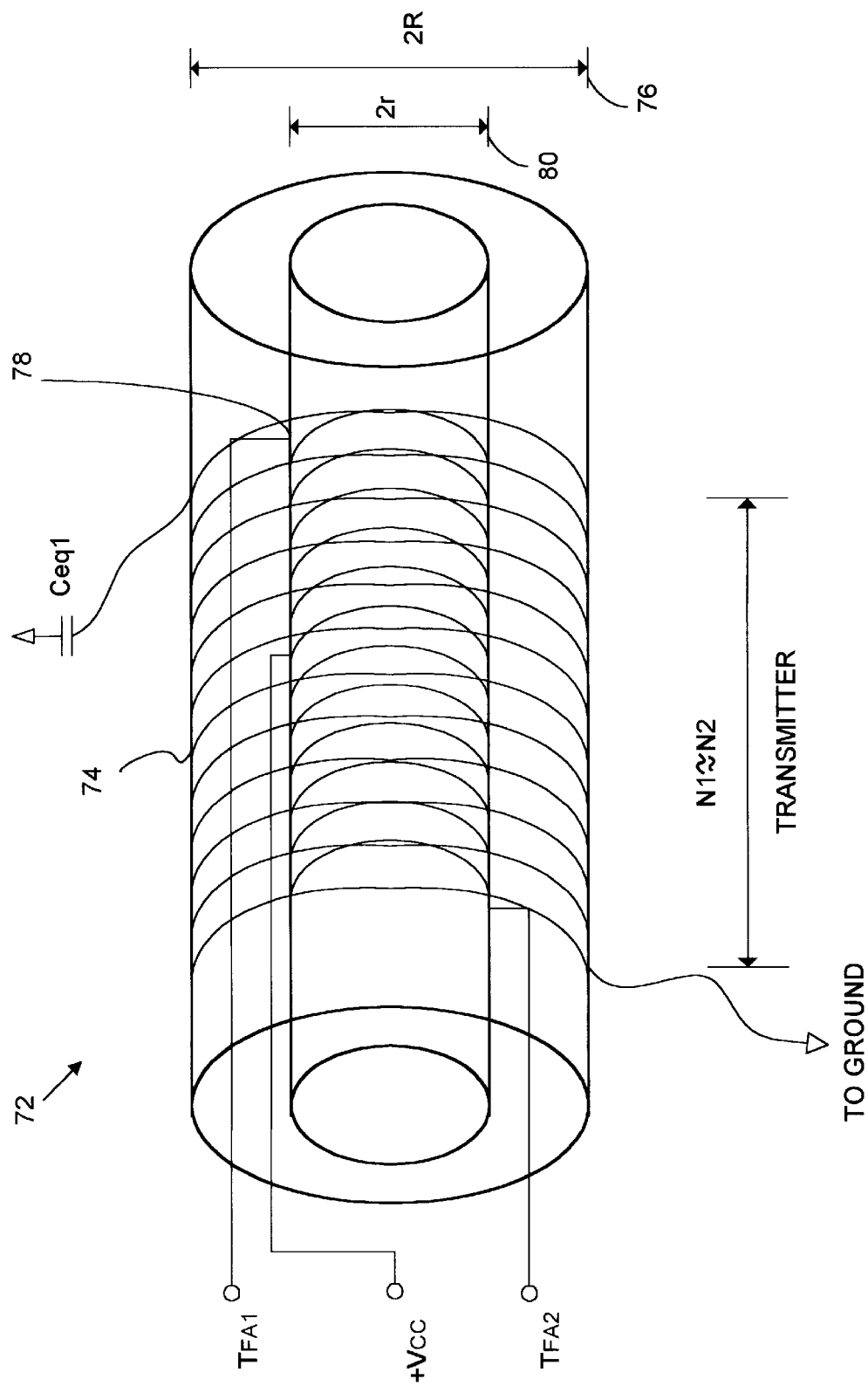
FIG. 5 illustrates a coaxially extended air-core transformer with a coupling capacitor in accordance with the present invention.

As explained in greater detail below in the aforementioned U.S. Pat. No. 5,559,377, the first and second couplers 52, 68 include a pair of serial LC circuits which are coupled to the electrical wiring 12 and are connected to respective power-line transformers (FIG. 5). Each of the serial LC circuits in a respective one of the couplers 52, 68 resonate at a given frequency. The LC circuits include a plurality of capacitors which are connected in a series and parallel configuration. The capacitor networks create equivalent capacitances Ceq1 and Ceq2 for transmission and reception, respectively. The capacitor networks are connected to the transformers and resonate with a primary winding of the transformers. The transformers serve as the inductive (L) component of the respective LC circuits, for both transmission and reception. In transmitting data over the electrical wiring 12, the transformer coupled with the coupling capacitor provides resistive matching to both sides of the electrical wiring 12 to establish a phase shift linear system which reduces coupling losses.

FIG. 5 illustrates a transformer 72 for use with the present invention. The transformer 72 has a primary coil 74 with a first diameter 2R 76 and a secondary coil 78 having a second, smaller diameter 2r 80. The secondary coil 78 extends coaxially within the primary coil 74 such that an air-gap is created between the primary and secondary coils 74, 78. The primary and secondary coils 74, 78 have primary and secondary inductances L1 and L2 respectively. Both L1 and L2 are inductively and capacitively coupled, thereby creating an air-core transformer.

The matching of the line impedance and the use of the air-core transformer 72 are responsible for the amount of phase linearity achieved. In fact, the phase response of the overall transmission system is linear over a very wide range of frequencies. This implies that almost any desired frequency range can be selected for communication. Also, standing waves are virtually suppressed due to the low resistive matching at both ends of the line.

Another practical advantage of the air-core transformer 72 is that the transmitted signal level into the power line or electrical wiring 12 is about the same at every outlet (time and location independent) 14 due to the low resistive matching to the electrical wiring 12 characteristic impedance at a pre-selected carrier frequency. Consequently, a low radiation emission level is the same from every outlet 14 as well.

The couplers 52, 68 can be connected to a pair of power lines several ways. The most preferred way is to connect the Ceq capacitor to the power line phase and the transformer primary winding 74 to the Ceq capacitor and to the neutral of the power line. It is common that 120 volt outlets do not always have proper connections to the hot and neutral. The coupler capacitor Ceq can be connected to the neutral and the primary winding 74 to the hot. The coupler capacitor Ceq can also be connected to the neutral and the primary winding 74 to the ground. Furthermore, the transformer 72 can be connected between two phases as well as between phase and ground. The couplers 52, 68 are suitable for communication in association with a wide range of power-line voltages, including high voltage, low voltage, twisted pair, coaxial, and phone line communications, as well as for communication directly through power line transformers. Further details concerning the transformer 72 may be found in the aforementioned U.S. Pat. No. 5,559,377.

Figure 4:
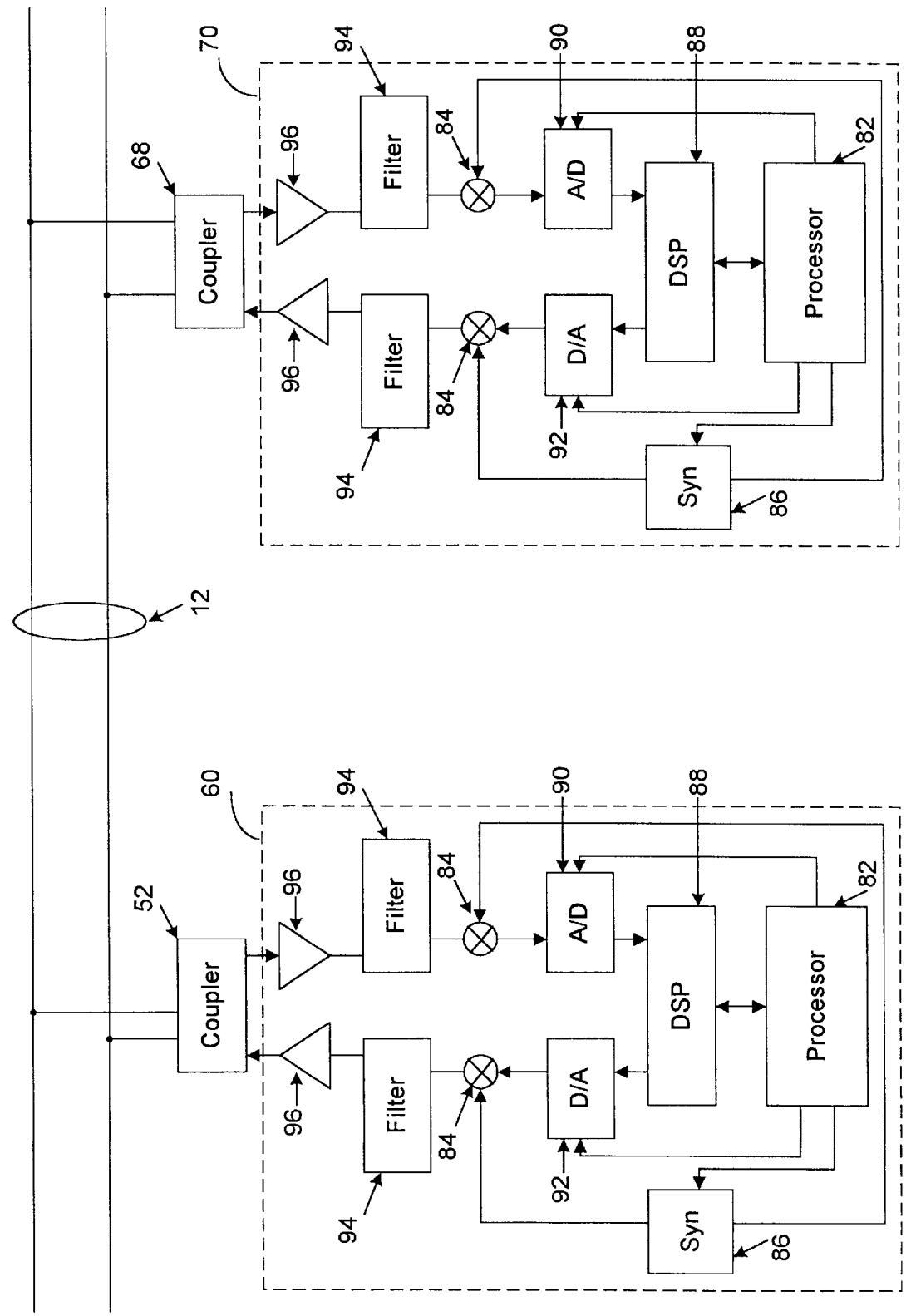
FIG. 4 is a more detailed schematic block diagram of the FM power line communications system shown in FIG. 3.

Referring now to FIG. 4, a more detailed schematic block diagram of the power line communication apparatus 50 for transmitting data over the power or electrical wiring 12 is shown. The modems 60, 70 include a processor 82, mixers 84, a synthesizer 86, a digital signal processor (DSP) 88, an A/D converter 90, a D/A converter 92, filters 94 and amplifiers 96. In such a digitally signal processed video transmission system, the microprocessor 82 is interfaced using MPEG I to achieve 1.5 Mbps speed and MPEG II to achieve 6 Mbps speed. In a receive scenario, data transmitted over the electrical wiring 12 is received by the coupler 52 (or 68), is buffered and band pass filtered by the amplifier 96 and the filter 94. Next, the data is down converted by the mixer 84 and converted to digital data by the A/D converter 90. The DSP 88 can then demodulate the digital data, using either FSK or QPSK. The opposite procedure occurs for a transmit operation. Although it is presently preferred to use the DSP 88, the logical functions performed by the DSP 88 could also be implemented using other means, such as a Field Programmable Gate Array (FPGA). The synthesizer 86 may comprise a local oscillator of the mixer 84.

It has been determined that there are several interfering signals below 15 MHZ that are picked up by the electrical wiring 12. Usually between 15 to 30 MHZ there is little or no interference, except for between 27 and 28 MHZ there are CB stations. According to the present invention, FM video data is transmitted using a band from about 18 to about 27 MHZ with a bandwidth of around 5 MHZ. In order to avoid any interference which may be picked up, it is desirable to be able to move the video band every 300 kHz within 18–27 MHZ band. In this manner, the least crowded band in a given location may be selected. Thus, interference is avoided and data is transmitted according to the best or suitable phase linearity of the electrical wiring 12 and the outlets 14. Varying the carrier frequency also aids to assure the same high speed communication in every outlet 14 (in an AC wiring scheme). Moreover, dynamically moving the carrier frequency allows the widest linear response to the couplers 52, 68 to be determined and selected. The synthesizer 86 may be used to implement a change in the transmission frequency. In order to shift the frequency band at which the video data is transmitted, a button or switch is provided which initiates a change of the frequencies at the receive end (at the location of the second display device 28 (FIG. 1). According to the present invention, the R/C transmitter 32 sends a signal at a frequency of about 450 Hz to the second transmitter 64 to change the frequency at the transmit end (i.e. first communications apparatus 26). The R/C transmitter 32 also transmits IR signals to the second communications apparatus 30 to change the channel selected for viewing.

In order to move the carrier frequency of the signal transmitted over the electrical wiring 12, the first and second modems 60, 70 perform a handshaking procedure to determine the carrier frequency which will be used for data transmission. That is, the first or transmitting modem 60 transmits the carrier frequencies in sequence before actual data transmission begins. The second or destination modem 70 knows the actual sequence and receives some of the transmitted carrier frequencies depending on the best phase linearity of the power line 12 and the power line outlets 14 (FIG. 1) and on interference. The second modem 70 then transmits back to the first modem 60 information concerning the frequency with the least interference or noise (i.e. the best transmission frequency for the given electrical wiring 12), thereby informing the first modem 60 of the first selected carrier frequency FA. The second carrier frequency is determined in a similar manner. The modems 60, 70 then communicate at the selected carrier frequencies. It is to be appreciated that the couplers 52, 68 of the present invention will permit more than one carrier frequency to be simultaneously transmitted through the same power line.

Figure 6:
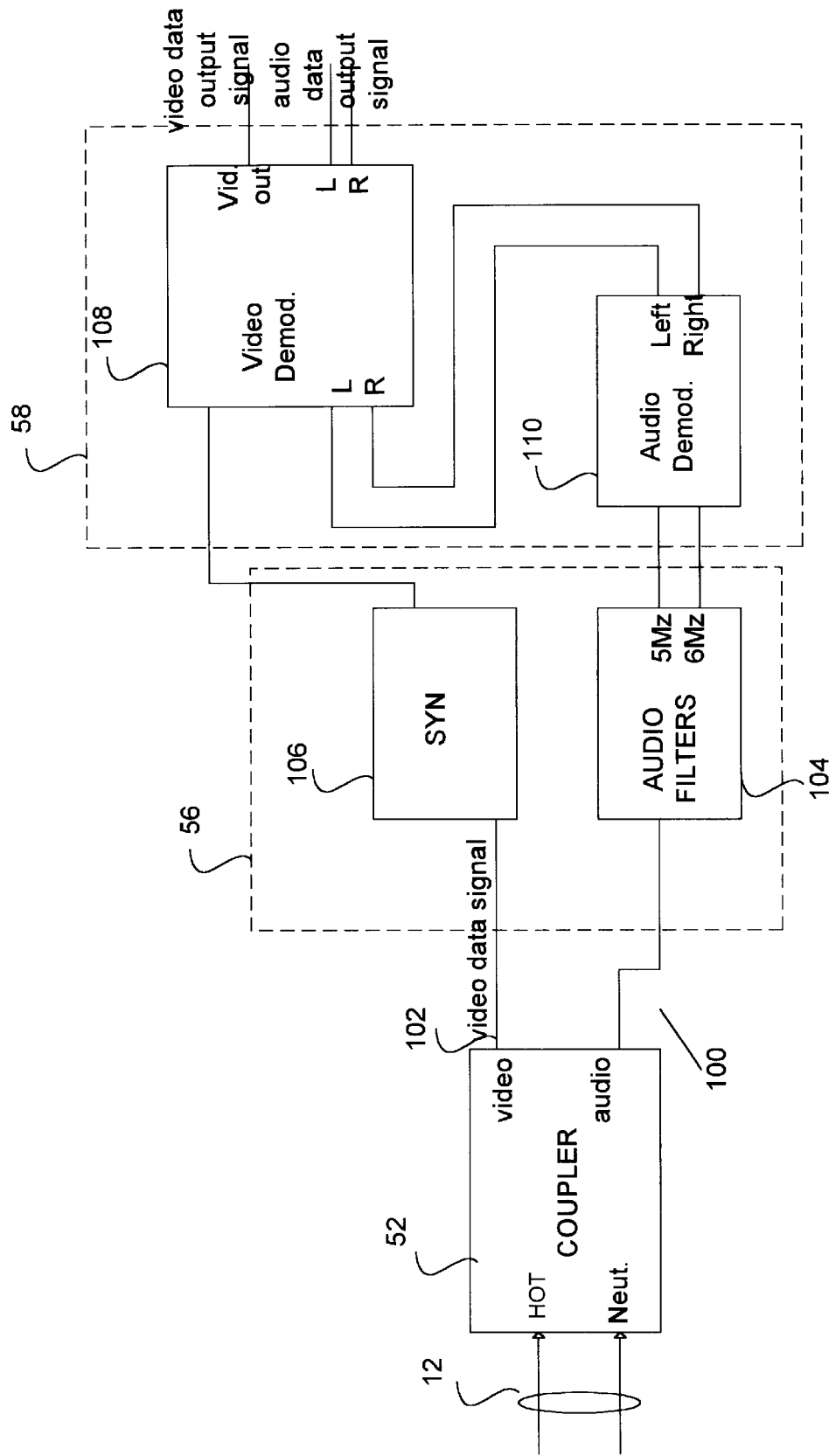
FIG. 6 is a schematic block diagram of an FM receiver system in accordance with the present invention.

Referring now to FIGS. 6–11, more detailed electrical schematic diagrams of the receiver side of the power line communications apparatus 50 used for transmitting video data over AC electrical wiring are shown. FIG. 6 shows the coupler 52 connected to the electrical wiring 12. The coupler 52 receives the RF signals (i.e. the FM carrier signal) transmitted over the electrical wiring 12. The coupler 52 includes an RF splitter which separates the audio data and the video data and includes two output lines 100, 102 for outputting an audio data signal and a video data signal, respectively, which are provided to the first receiver 56. The audio data signal on line 100 is connected to an audio filter circuit 104 which separates the stereo audio data signal into its respective left and right components using a 5 MHZ filter and a 6 MHZ filter. The video data signal on line 102 is connected to a synthesizer 106. The synthesizer 106 is provided for altering, moving, shifting or otherwise digitally changing the carrier frequency, as previously discussed. The synthesizer 106 is connected to a video demodulator 108, which demodulates or recovers the synthesized video data signal and provides a video data output signal. The audio filter circuit 104 is connected to an audio demodulator 110, which receives the 5 MHZ and 6 MHZ audio signals and generates respective left and right audio signals. The left and right audio signals are input into the video demodulator 108, demodulated, and output as demodulated left and right audio data output signals.

Figure 7:
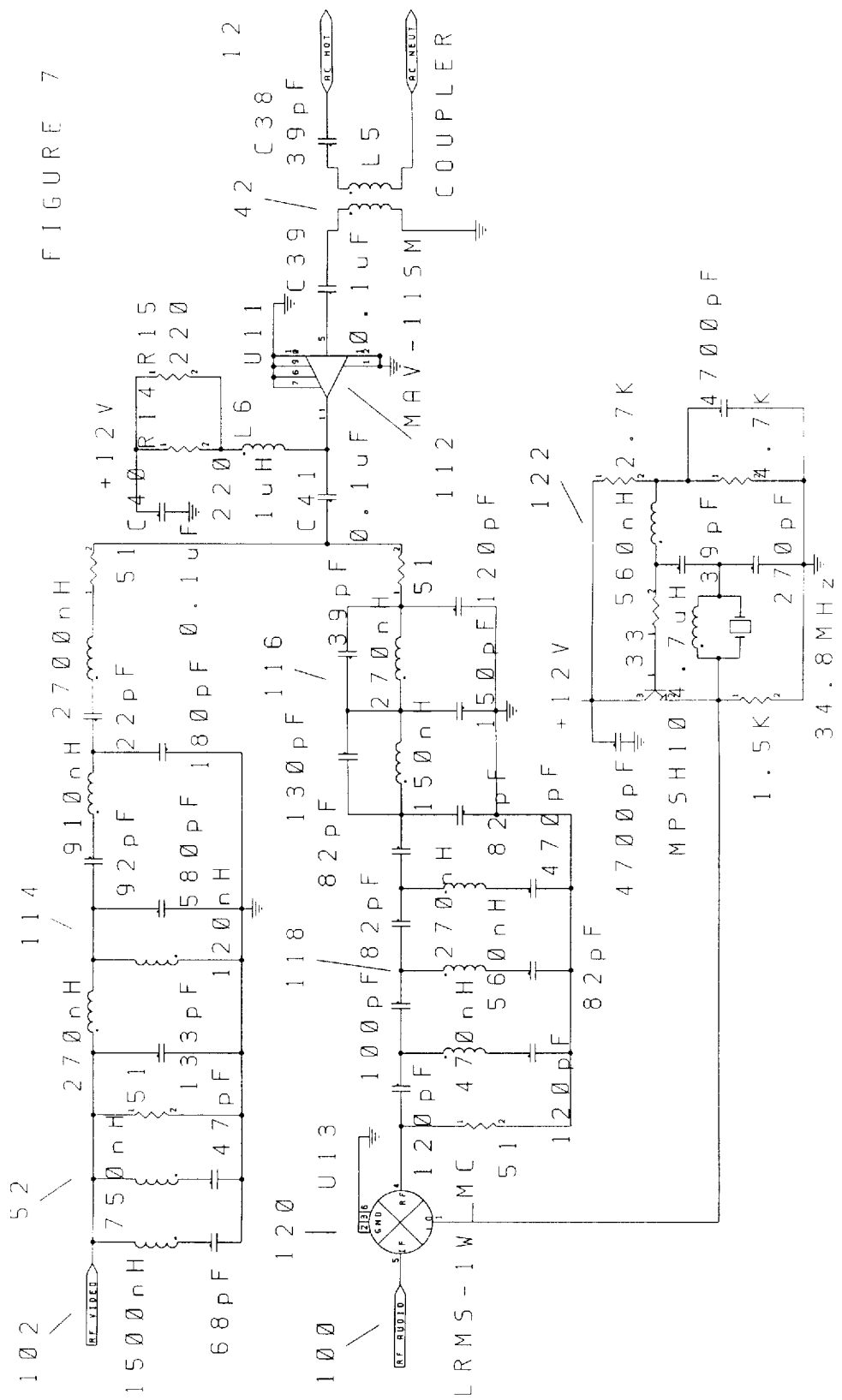
FIG. 7 is a more detailed electrical schematic diagram of the coupler of the FM receiver system FIG. 6.

FIG. 7 is a more detailed schematic diagram of the coupler 52 of FIG. 6. The coupler 52 is connected to the electrical wiring 12, preferably as shown with a hot wire and a neutral wire of the wiring 12 being connected to the transformer 72, which thus receives both audio and video data transmitted over the electrical wiring 12. The transformer 72 is connected to an amplifier circuit 112. The amplifier circuit 112 is connected to a blinch filter circuit 114 which is provided for selecting the video data from the received signal. That is, the blinch filter circuit 114 separates the 18–26 MHZ band out of the amplified signal. The amplifier circuit 112 is also connected to a low pass filter circuit 116, a high pass filter circuit 118, a mixer 120, and a local oscillator 122, which separates out the audio data transmitted over the electrical wiring at a frequency between 28–30 MHZ and provides the 5–6 MHZ audio data output signal.

Figure 8:
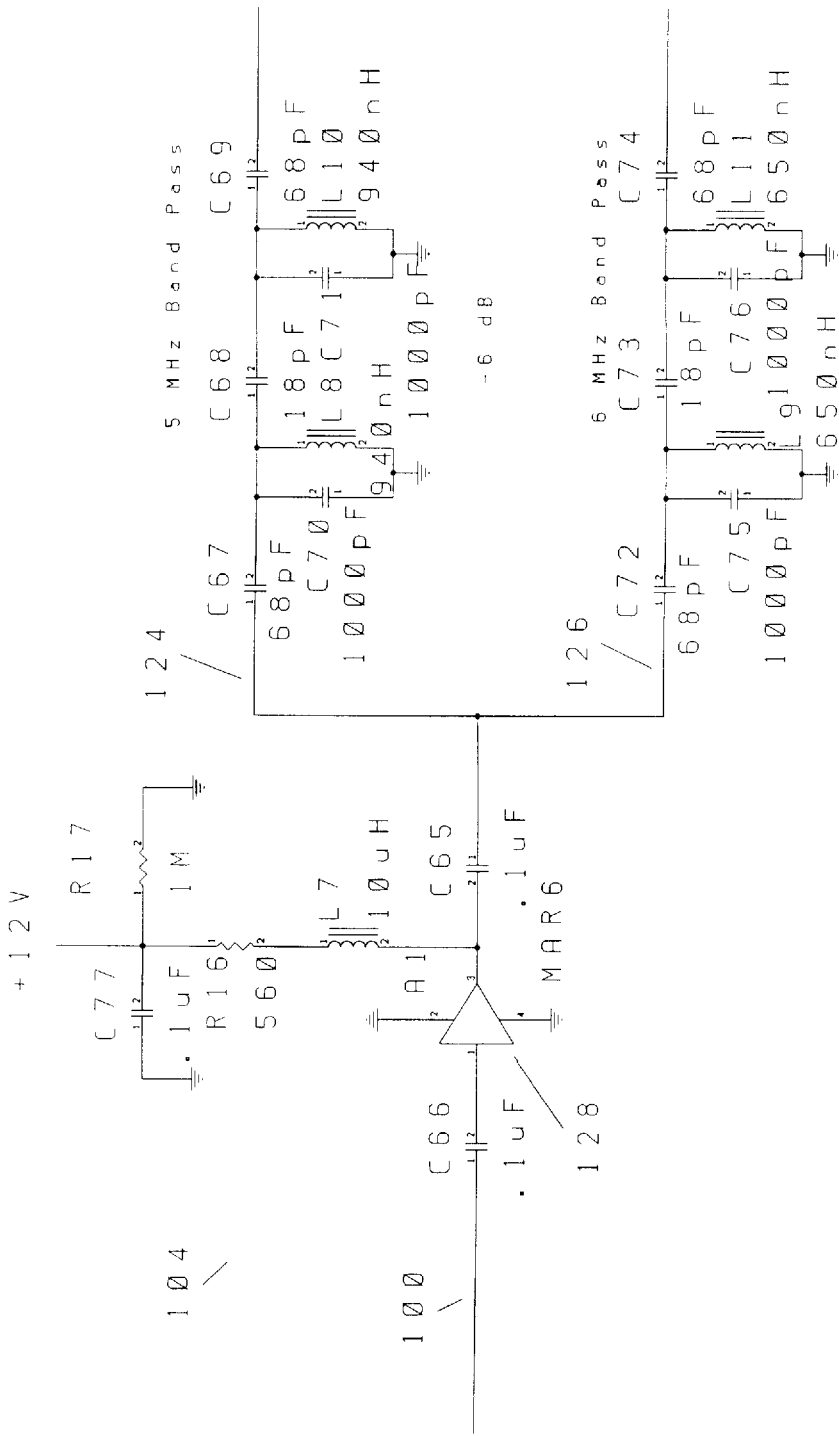
FIG. 8 is a more detailed electrical schematic diagram of an audio filter circuit of the FM receiver system FIG. 6.

FIG. 8 is an electrical schematic diagram of the audio filter circuit 104, which includes a 5 MHZ band pass filter circuit 124, a 6 MHZ band pass filter circuit 126, and an RF amplifier 128. The RF amplifier 128 receives the audio data input signal on the line 100 from the coupler 52, boosts the signal, and transmits the signal to the 5 MHZ and 6 MHZ band pass filter circuits 124, 126, which filter the stereo audio signal.

Figure 9:
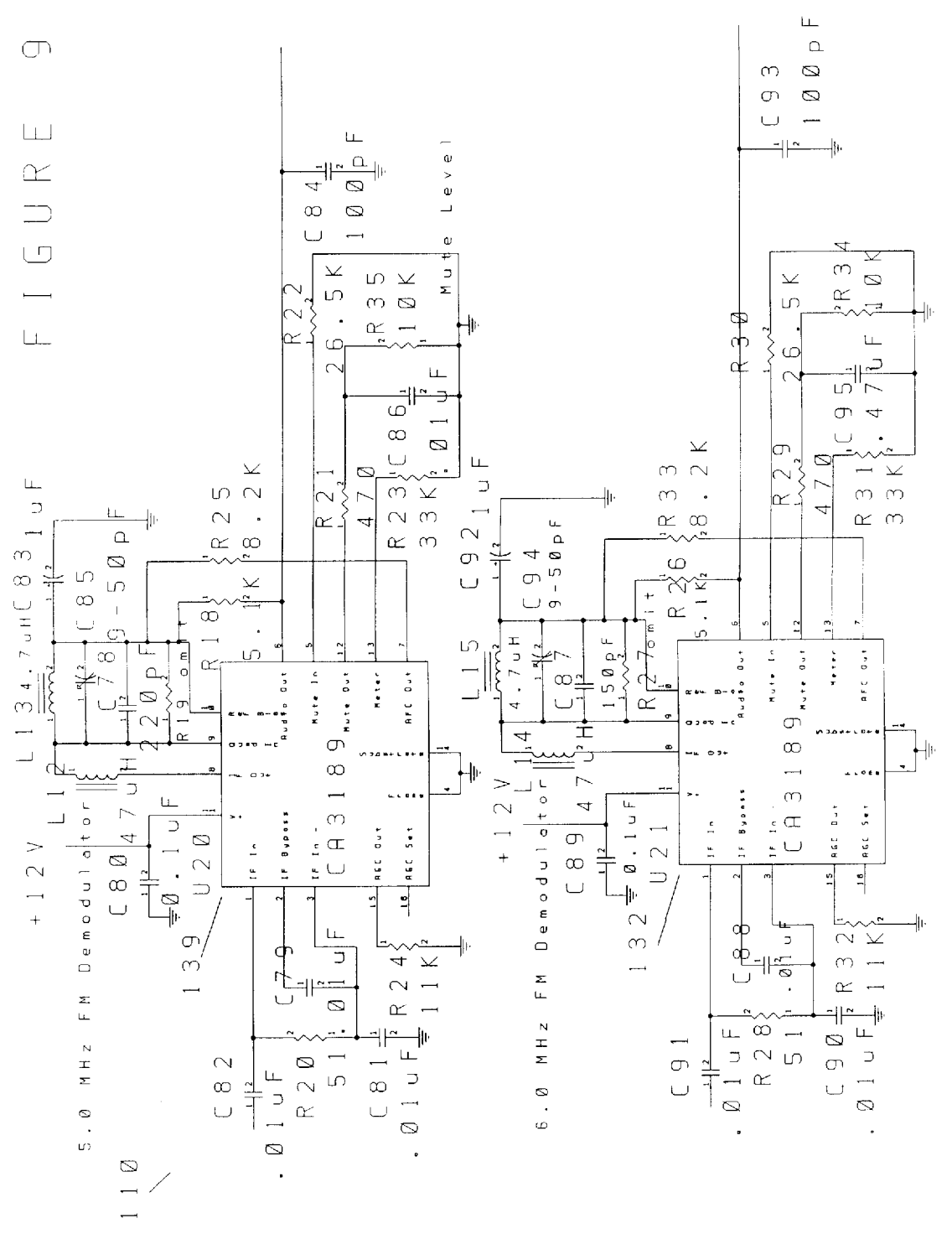

FIG. 9 is an electrical schematic diagram of the audio demodulator 110 connected to the audio filter circuit 104. The 5 MHZ and 6 MHZ signals output from the audio filter circuit 104 are input to the audio demodulator 110. The audio demodulator 110 preferably comprises a 5 MHZ demodulator circuit 130 and a 6 MHZ demodulator circuit 132, which provide the left and right audio signals to the video demodulator 108. A Motorola CA3189 is a suitable audio demodulator.

Figure 10:
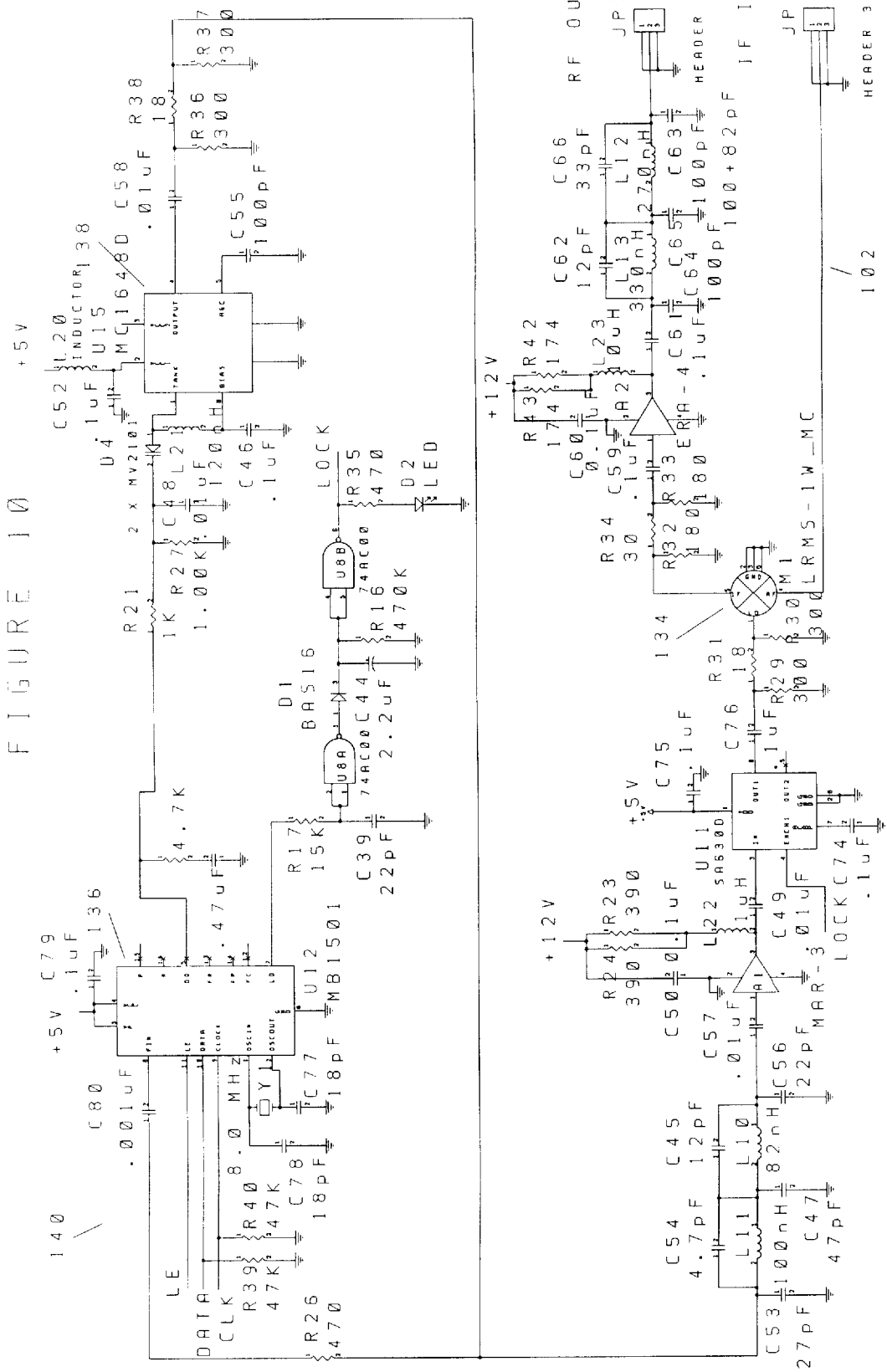
FIG. 10 is a more detailed electrical schematic diagram of a digital PLL, and synthesizer circuit of the FM receiver system of FIG. 6.

FIG. 10 is an electrical schematic diagram of the synthesizer 106 (FIG. 6) used to shift the frequency of the video data signal. The video data signal on line 102 is an input to a mixer 134. The output of the mixer 134 is the frequency shifted video data signal which is provided as an input to the FM video demodulator 108. The other input to the mixer 134 is the frequency. The frequency input is generated with a synthesizer 136 connected to a voltage controlled oscillator 138 which generates a local oscillator signal. The voltage controlled oscillator 138 may be a Motorola MC1648 voltage controlled oscillator. The synthesizer 136 also receives control signals 140, as specified by a control panel or control switch (not shown), for either specifying the frequency or indicating that the frequency is to be shifted. The mixer 134 mixes the video data signal at the first preselected frequency with the local oscillator signal and generates a carrier signal at the second predetermined frequency, which is shifted from the first frequency. Preferably, the carrier frequency is shifted in increments of about 300 KHz.

Figure 11:
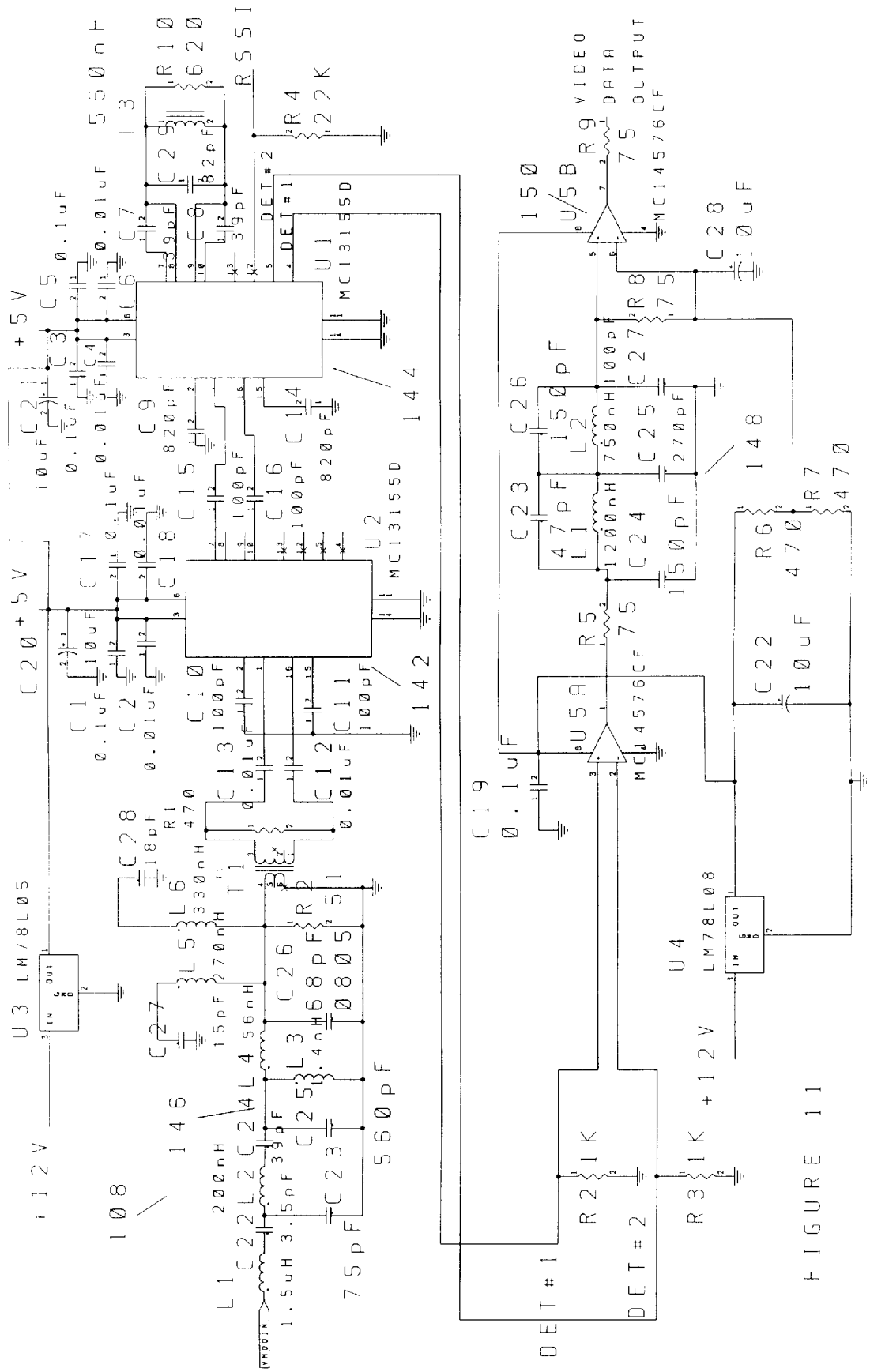
FIG. 11 is a more detailed electrical schematic diagram of an FM video demodulator the FM receiver system of FIG. 6.

FIG. 11 is a detailed electrical schematic diagram of the video signal demodulation portion of the FM video demodulator 108 of FIG. 6. The FM video demodulator 108 preferably comprises first and second wideband FM detector devices 142, 144 connected in a cascade arrangement, as is known by those of ordinary skill in the art. In the presently preferred embodiment, the first and second detectors comprise Motorola MC13155 Wideband FM detectors, which are commercially available from Motorola, Inc. The video demodulator 108 video input, is filtered using a blinch filter circuit 146 prior to connecting the input to the cascaded detector circuits 142, 144. The blinch filter 146 preferably has a very small group delay (less than about 2 nS). The blinch filter 146 includes filters at 27 MHZ and 15.4 MHZ to prevent interference at these frequencies, such as from CB radios. In the detector circuit cascade arrangement, the output of the first detector 142 is input to the second detector 144. The output of the second detector 144 is provided to a filter circuit 148 and then to an op. amp 150. The output of the FM video demodulator 108 may be used as the video input to the display device 12.

Figure 12:
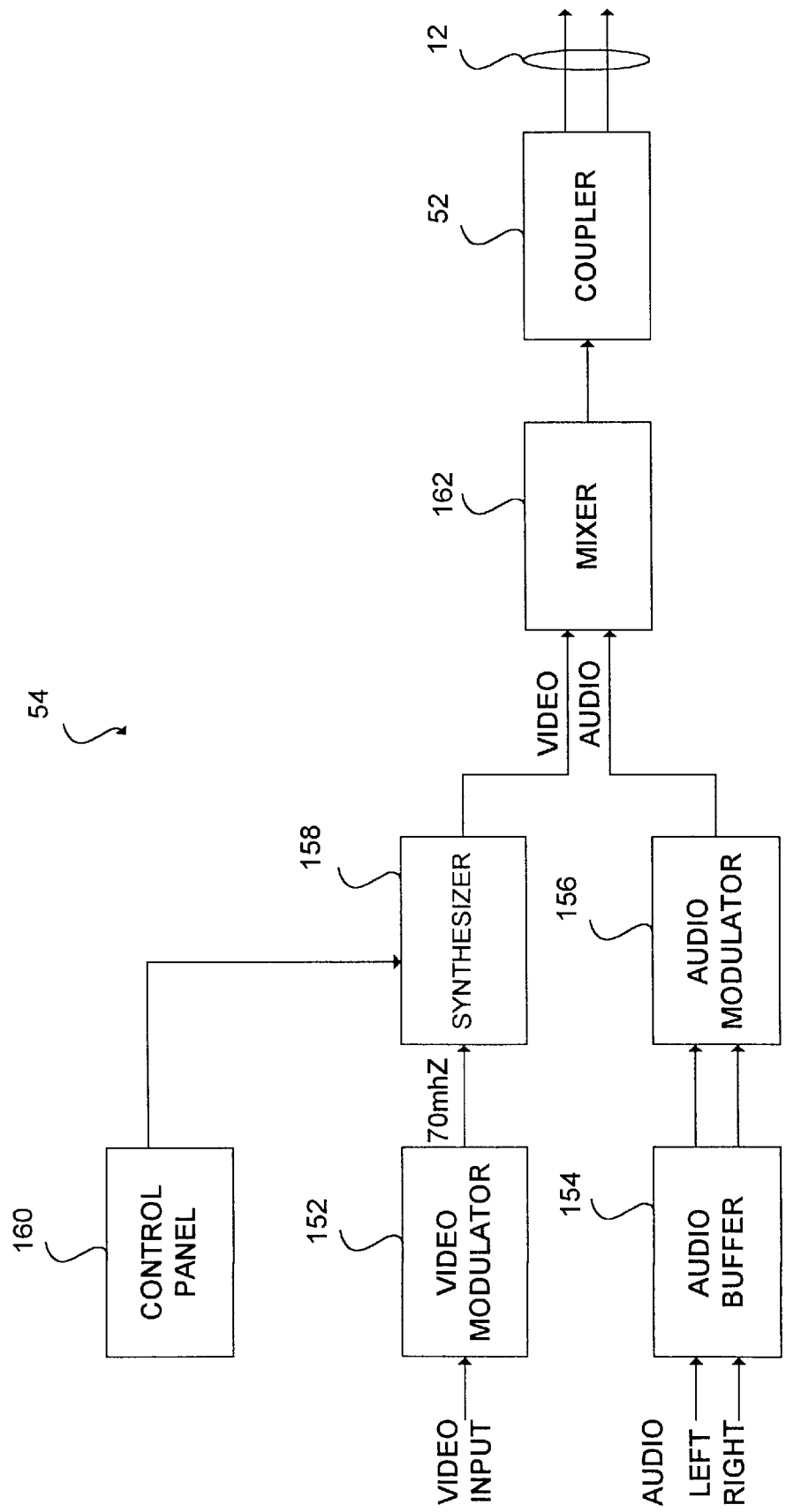
FIG. 12 is a schematic block diagram of an FM transmitter system in accordance with the present invention.

Referring now to FIGS. 12–18, more detailed electrical schematic diagrams of the transmitter side of the power line communications apparatus 50 used for transmitting video data over AC electrical wiring are shown. FIG. 12 shows the coupler 52 connected to the electrical wiring 12. The coupler 52 connects the transmitter 54 to the electrical wiring 12. Basically, the transmit side includes a video modulator 152, an audio buffer 154, an audio modulator 156, a synthesizer 158, a control panel 160 and a mixer 162.

The video modulator 152 takes a video data input signal, such as from a video camera 38 (FIG. 2A), modulates the data input, and generates a modulated output signal at a predetermined frequency, such as 70 MHZ. The video modulator 152 is connected to the synthesizer 158, which receives the modulated output signal and changes or converts the frequency of the signal, such as to 20 MHZ. Simultaneously, the audio buffer 154 receives a stereo audio signal having respective left and right channels, and separately buffers the left and right channel signals. The audio buffer 154 is connected to the audio modulator 156. The audio modulator 156 receives the buffered audio signal, combines and filters the left and right channels, and generates an audio output signal.

The mixer 162 is connected to the audio modulator 156 and the synthesizer 158. The mixer 162 combines the modulated video signal and the audio output signal. The output of the mixer 162 is connected to the coupler 52, which amplifies the mixer signal. The coupler 52 also matches the output impedance of the transmitter 54 to the characteristic impedance ($Z_O$) of the electrical wiring 12, such that the mixer output signal (i.e., the RF output signal) is communicated to the electrical wiring 12 without significant phase distortion.

Figure 13:
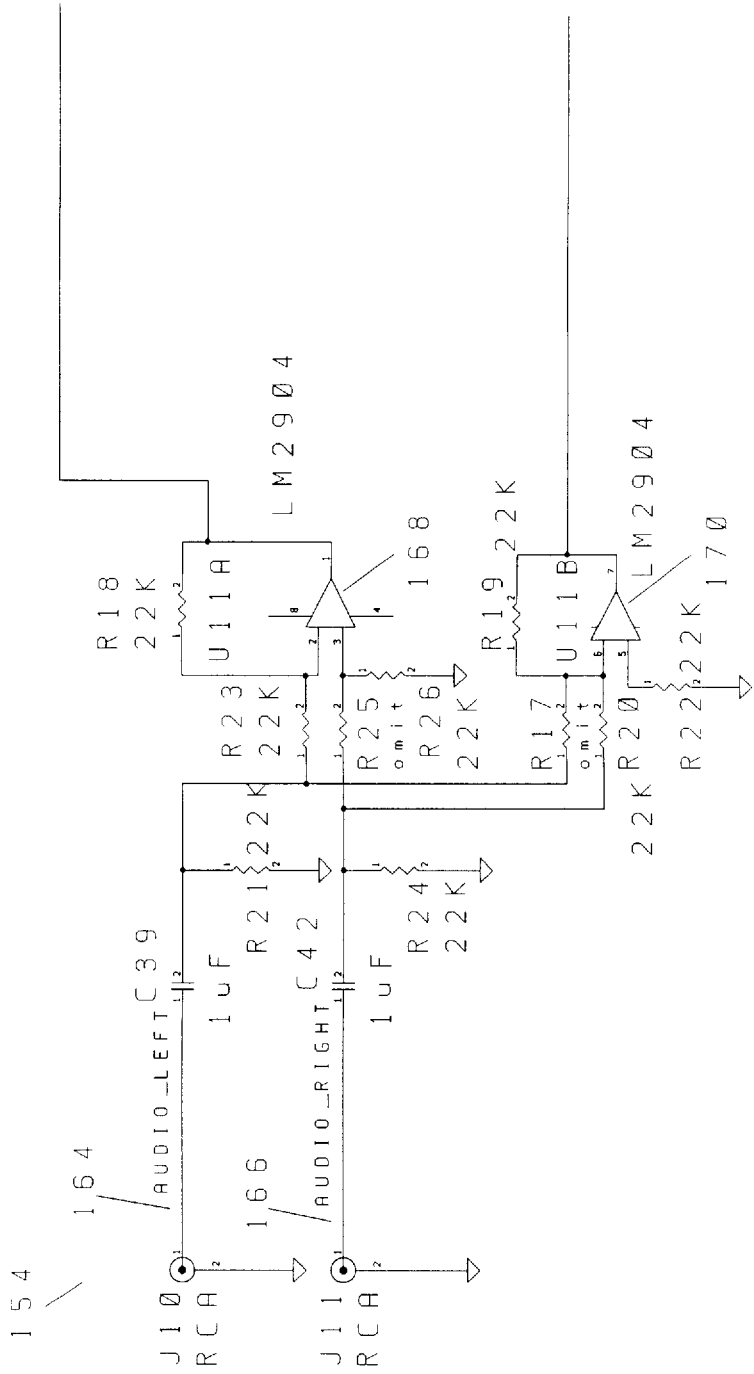
FIG. 13 is a more detailed electrical schematic diagram of an audio signal input of the FM transmitter of FIG. 12.

FIG. 13 is a more detailed electrical schematic diagram of the audio buffer 154 of FIG. 12. The audio buffer 154 has as inputs, the respective left and right audio channels, indicated at 164, 166. Each of the left and right audio channels is connected to a respective operational amplifier 168, 170. The respective left and right outputs of the operational amplifiers 168, 170 are connected to the audio modulator 156.

Figure 14:
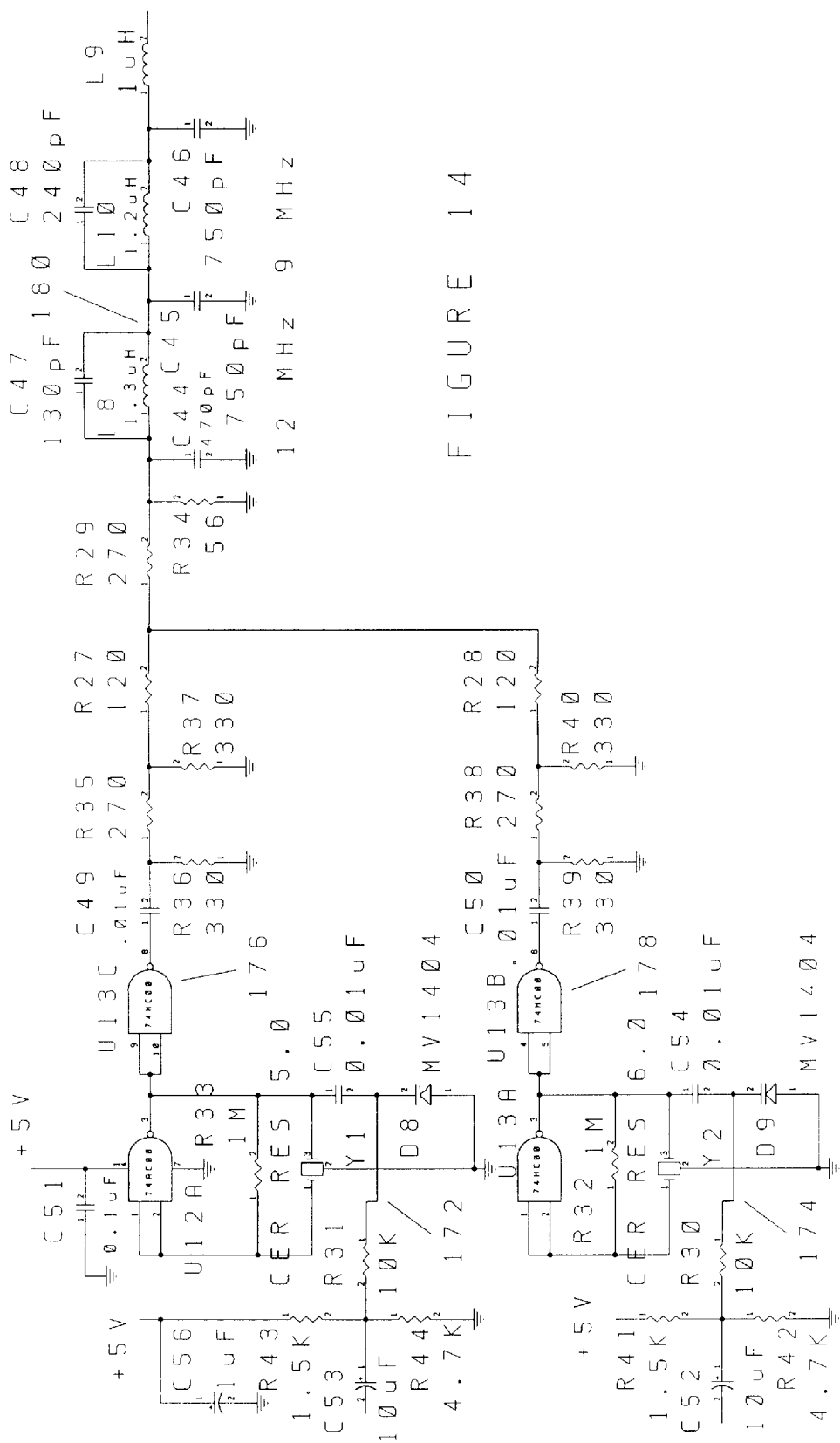
FIG. 14 is a more detailed electrical schematic diagram of an audio modulator of the FM transmitter of FIG. 12.

FIG. 14 is a more detailed electrical schematic diagram of the audio modulator 156 of FIG. 12. The audio modulator 156 includes a pair of voltage controlled oscillator circuits 172, 174 for receiving and modulating the left and right audio outputs of the audio buffer 156, respectively. Preferably, the left audio channel is modulated with a 5 MHZ frequency and the right audio channel is modulated with a 6 MHZ frequency. The 5 MHZ and 6 MHZ signals are then buffered with respective gates 176, 178, combined, and then band pass filtered with a 6.5 MHZ low pass filter circuit 180. The output of the filter circuit 180 is connected to the mixer 162.

Figure 15:
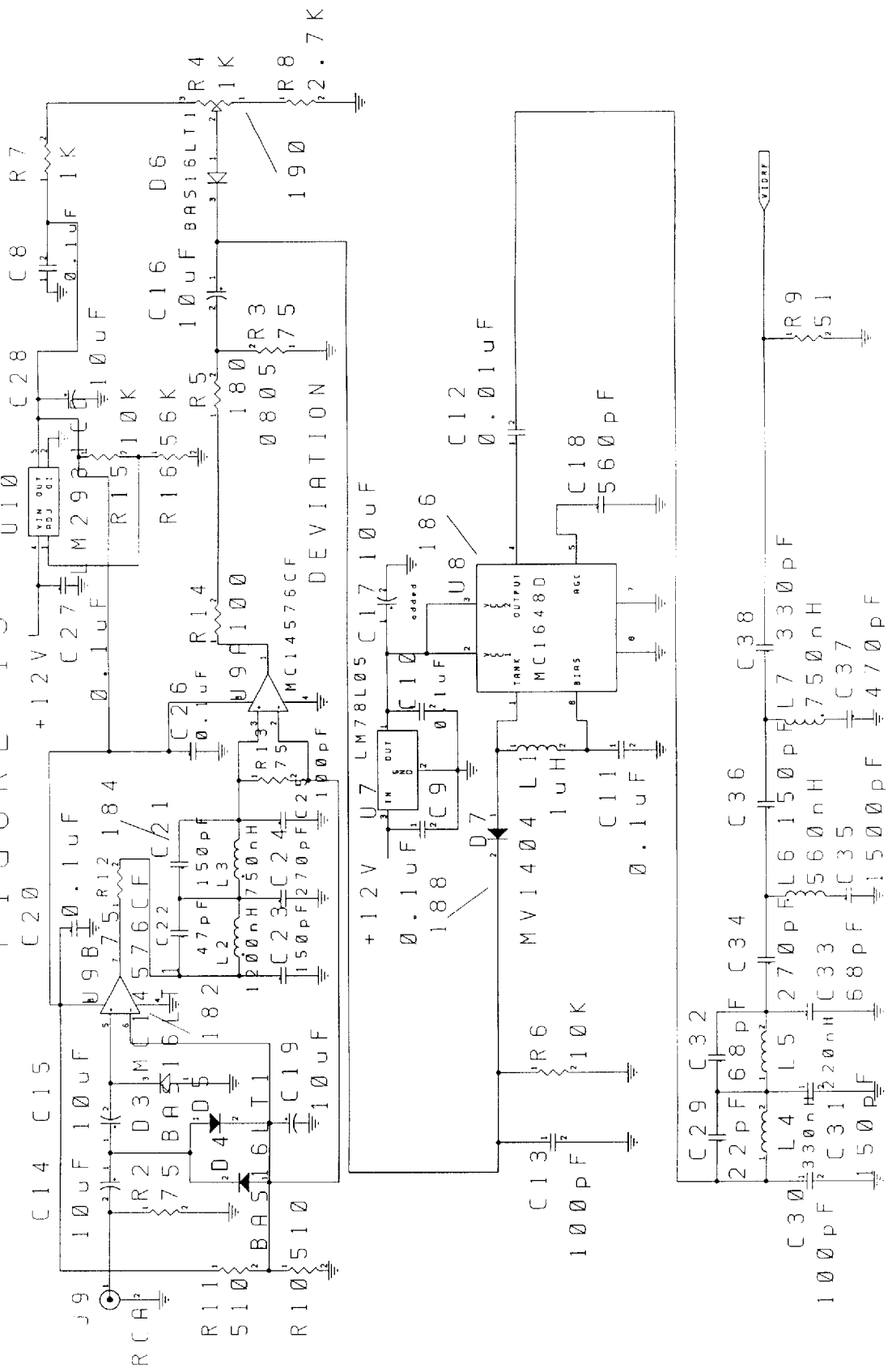
FIG. 15 is a more detailed electrical schematic diagram of an FM video modulator of the FM transmitter of FIG. 12.

FIG. 15 is a more detailed electrical schematic diagram of the video modulator 152 of FIG. 12. The video modulator 152 receives a baseband input from a source of video data, such as a video camera. The baseband input signal is buffered and low pass filtered by an operational amplifier 182 and a low pass filter (LPF) circuit 184. The buffered and filtered video signal is then modulated with a predetermined carrier frequency. In the presently preferred embodiment, the video signal is frequency modulated using a Motorola MC1648 oscillator 186. A hyper-diode 188 is connected between the oscillator 186 and the LPF circuit 184 to ensure that the video signal resonates at 70 MHZ. A resistor 190 is connected to the hyper-diode 188 and the LPF circuit 184 to set the resonant frequency. In the presently preferred embodiment, the resistor has a value of 1 k-ohm. As will be understood by those of ordinary skill in the art, if the resistor 190 were substituted with a variable resistor, it would be possible to vary the resonant frequency of the signal by varying the value of the resistor 190, as opposed to using the synthesizer 158 described below. The 70 MHZ video signal is then provided as an output of the video modulator 152.

Figure 16:
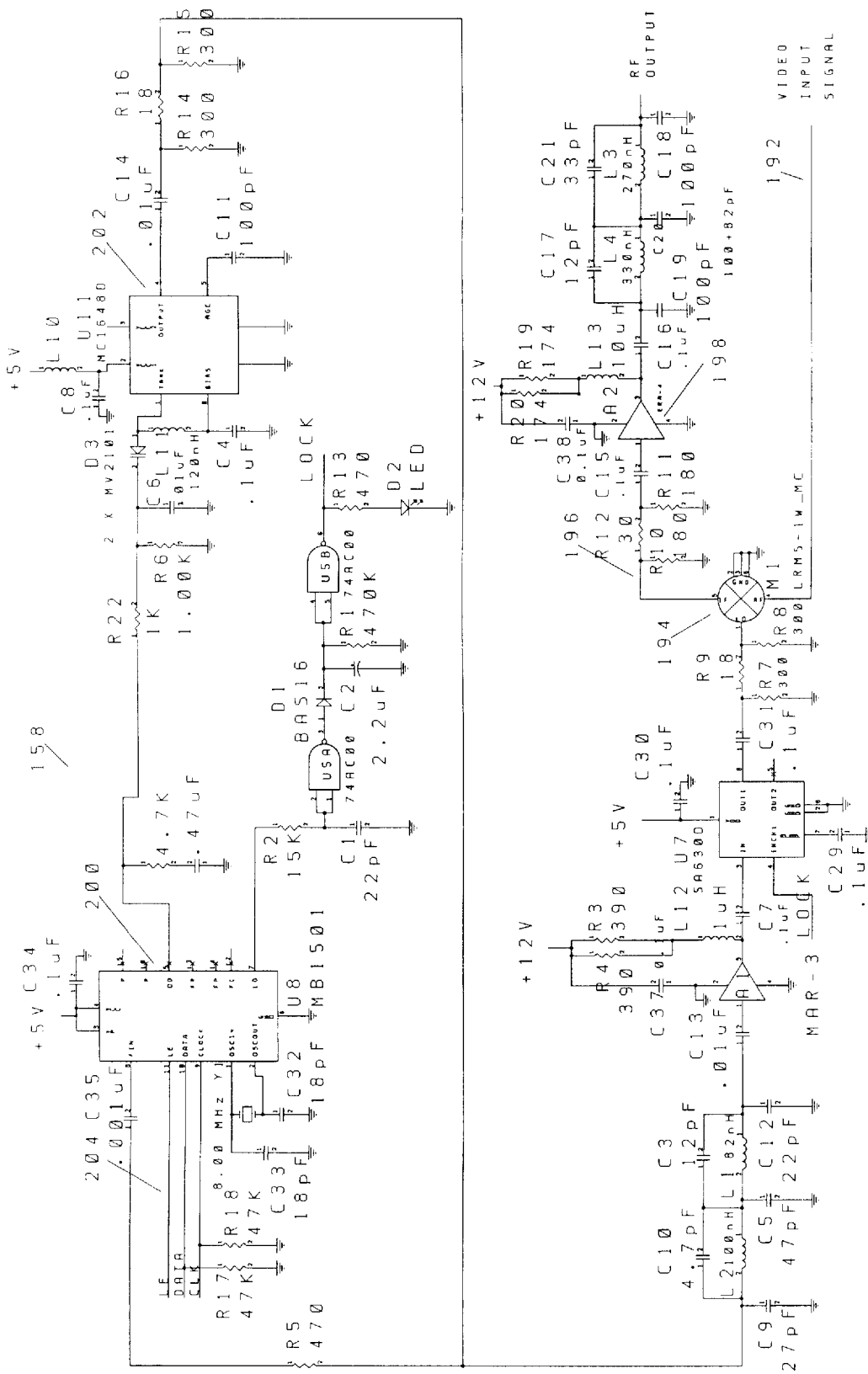
FIG. 16 is a more detailed electrical schematic diagram of a synthesizer of the FM transmitter of FIG. 12.

FIG. 16 is a more detailed electrical schematic diagram of the synthesizer 158 of FIG. 12. The synthesizer 158 is used to shift the frequency of the 70 MHZ video data signal. The 70 MHZ video data signal is input on line 192 and is input to a mixer 194. The output of the mixer 194 is a frequency shifted FM video signal on line 196. The FM video signal on line 196 is buffered by an operational amplifier circuit 198 prior to being output to the mixer 162. The carrier frequency input to the mixer 194 is generated using a synthesizer device 200 connected to a voltage controlled oscillator 202, which generates a local oscillator signal. The voltage controlled oscillator 202 may be a Motorola MC1648 oscillator and the synthesizer device 200 may be a Motorola MB1501 synthesizer. The synthesizer device 200 is connected to a control line 204, over which control signals from the control panel 160 are provided for shifting or moving the carrier frequency. As previously discussed, the preferred carrier frequency for the video data is between about 19 MHZ and 27 MHZ. The mixer 194 mixes the 70 MHZ video signal and the carrier frequency to generate an RF video signal on line 196.

Figure 17:
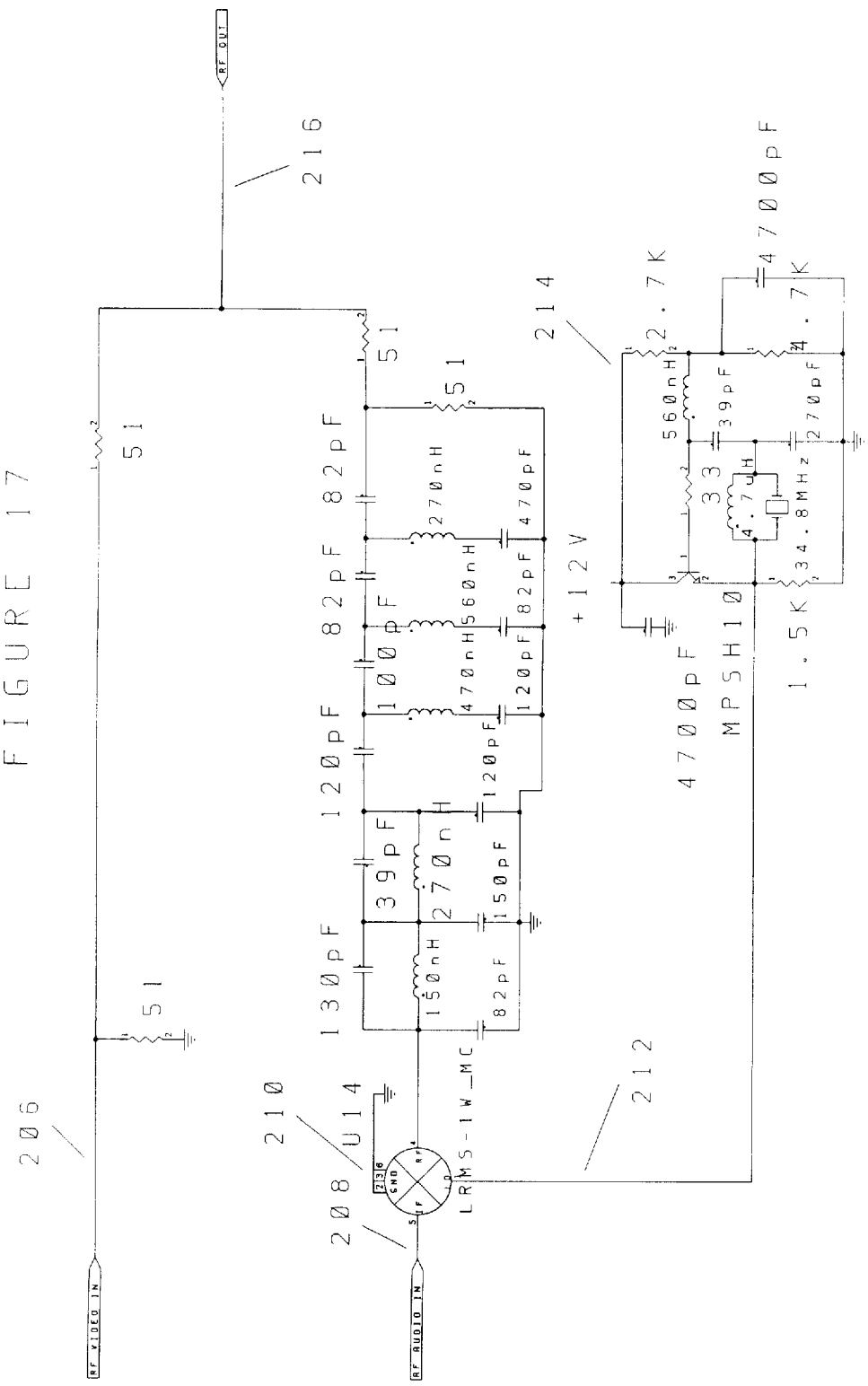
FIG. 17 is a more detailed electrical schematic diagram of a mixer of the FM transmitter of FIG. 12.

FIG. 17 is a more detailed electrical schematic diagram of the mixer 162 of FIG. 12. The mixer 162 receives the RF video signal from the synthesizer 158 on a line 206 and the combined audio signal from the audio modulator 156 on a line 208. The combined audio signal on line 208 is input to a mixer 210, along with a local oscillator signal on a line 212 generated by a local oscillator 214. The output of the mixer 210 is an audio signal having a frequency between about 28 MHZ to about 30 MHZ. The mixer 210 audio signal output and the RF video signal on the line 206 are combined and a composite signal is provided as an output on a line 216.

Figure 18:
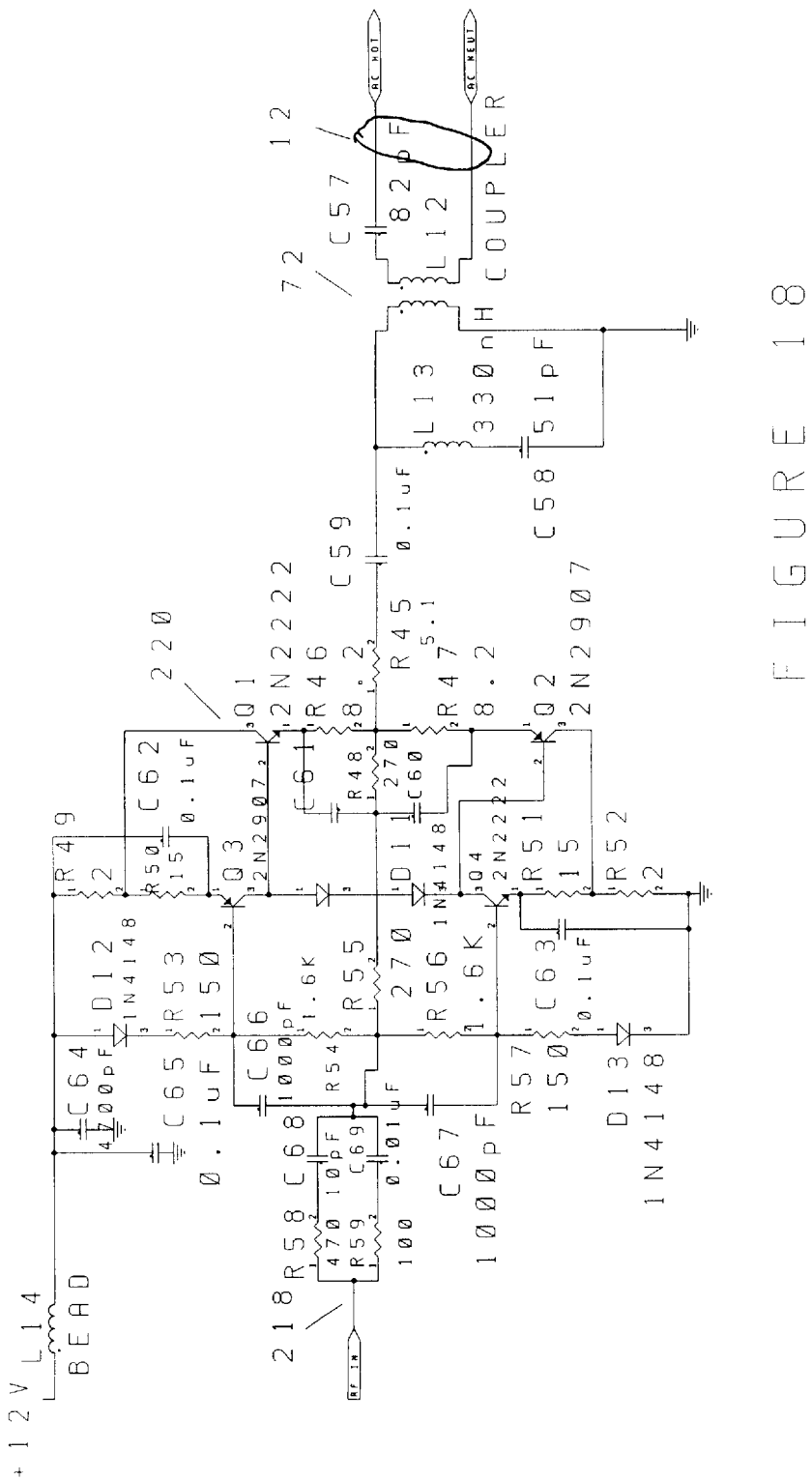
FIG. 18 is a more detailed electrical schematic diagram of a coupler of the FM transmitter of FIG. 12.

FIG. 18 is a more detailed electrical schematic diagram of the coupler 52 on the transmit side of the communications apparatus 50. The coupler 52 receives the composite signal on a line 218, and buffers the composite signal with an amplifier circuit 220. The buffered composite signal is then connected to the electrical wiring 12 by way of the transformer 72.

Figure 19:
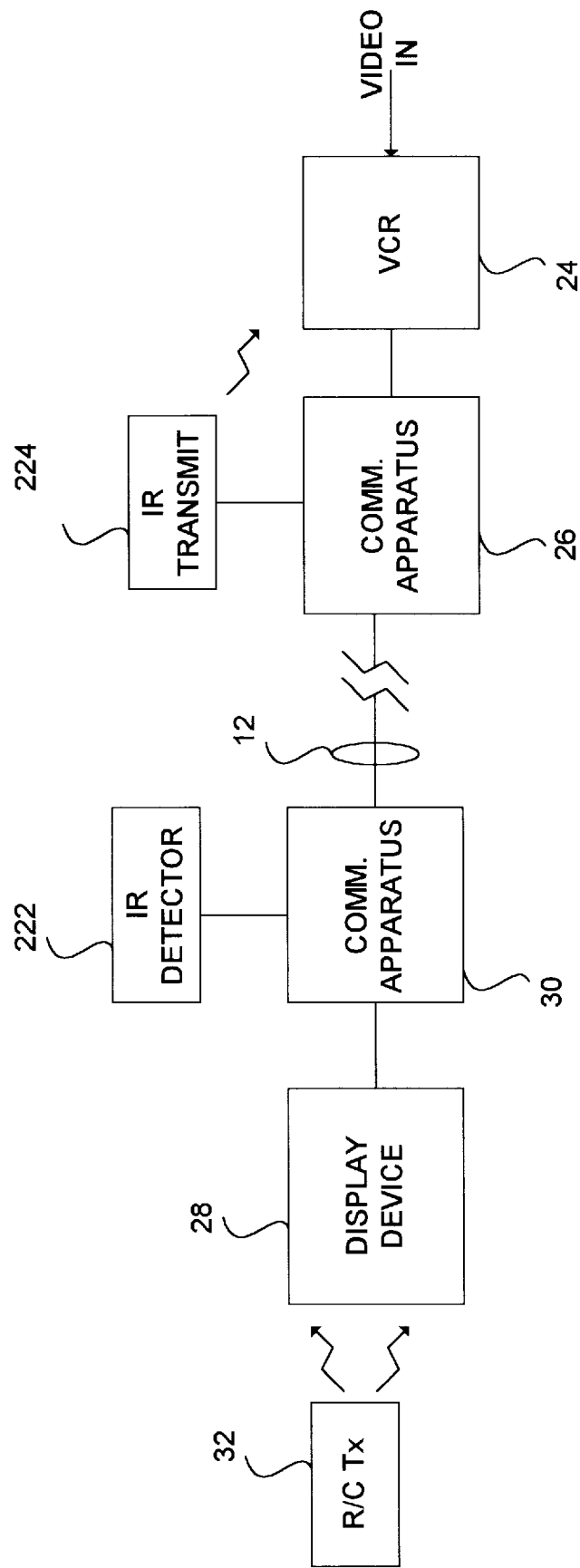
FIG. 19 is a schematic block diagram illustrating the transmission of an IR signal over a power line in accordance with the present invention.

FIG. 19 is a schematic block diagram illustrating the transmission of an IR signal, in addition to a video signal, over a power line in accordance with the present invention. A VCR 24 is connected to a source of video data, such as a CATV system. The VCR 24 is also connected to the home electrical wiring 12 by way of a first communications apparatus 26. A remote display device 28 is also connected to the home electrical wiring 12 by way of a second communications apparatus 30. As previously discussed in regard to FIG. 1, video data is transmitted from the first communications apparatus 26 to the second communications apparatus 30 over the electrical wiring in the frequency band between 19 and 30 MHZ. The channel selected for viewing is tuned by the VCR 24. However, the channel selected for viewing at the remote display device 28 may be changed using an associated remote control transmitter 32. That is, the R/C transmitter 32 emits a change channel or other data signal in a conventional manner. An IR detector 222 connected to the second communications apparatus 30 detects the IR signal. The second communications apparatus 30 then modulates the detected IR signal at a predetermined frequency and transmits the modulated signal over the electrical wiring 12 to the first communications apparatus 26. The first communications apparatus 26 includes an IR transmitter circuit 224, which converts the modulated data signal to a conventional IR signal. The IR signal is then emitted by the transmitter circuit 224. The VCR 24 receives the emitted IR signal in a conventional manner and performs the command specified thereby. The IR detector 222 and the IR transmitter 224 are constructed in a conventional manner. In the presently preferred embodiment, the IR detector 222 converts the detected IR signal to an RF signal, preferably having a frequency of about 455 kHz. The 455 kHz signal is preferably filtered using a 490 kHz low pass filter circuit prior to transmitting the signal through the transformer 72 of the second communications apparatus 30.

It will be appreciated by those skilled in the art that changes could be made to the embodiments described above without departing from the broad inventive concept thereof. For instance, according to the present invention, video transmission over power lines is possible using the aforedescribed circuits without the requirement of a coupler. For example, using a capacitor or a diode or a ferrite core transformer is enough to send a video signal into the power line. However, such elements generally will not provide a good quality signal and will have difficulty meeting government emissions regulations. According to the present invention, the best line matching occurs between around 1–10 ohms (resistive at the frequency of interest) to the power line characteristic impedance, and therefore, a video transmission system designed to be around 1–10 ohms will provide suitable picture quality, regardless of the type of coupler used. Thus, it is to be understood that this invention is not limited to the particular embodiment disclosed, but it is intended to cover modifications within the spirit and scope of the present invention as defined by the appended claims.

I claim:

1. A communications apparatus for communicating frequency modulated (FM) video signals through an electrical line having a characteristic impedance, the apparatus comprising:

a first FM modulator for frequency modulating the video data to produce a frequency modulated carrier signal having a first preselected frequency;

a first transmitter having an output impedance, connected to the first FM modulator, for transmitting the modulated carrier signal; and a first coupler connected between the electrical line and the first transmitter for matching the output impedance of the first transmitter to the characteristic impedance of the electrical line, wherein the first coupler comprises linear phase means for communicating the modulated carrier signal to the electrical line without significant phase distortion.

2. The communication apparatus of claim 1 wherein the linear phase means comprises an air-core transformer having a primary coil with a first diameter and a secondary coil having a second, smaller diameter, the secondary coil extending coaxially within the primary coil such that an air-gap is created between the primary and secondary coils.

3. The communications apparatus of claim 1 wherein the electrical line comprises an AC power line.

4. The communications apparatus of claim 1 wherein the electrical line comprises a DC power line.

5. The communications apparatus of claim 4 wherein the DC power line is a low voltage line.

6. The communications apparatus of claim 1 wherein the FM video signals comprise audio data and video data.

7. The communications apparatus of claim 6 wherein the audio data has a frequency in the range of about 28 to about 30 MHZ.

8. The communications apparatus of claim 6 wherein the video data has a frequency in the range of about 15 to about 27 MHZ.

9. The communications apparatus of claim 1 wherein the first modulator further comprises means for moving the modulated carrier frequency from the first preselected frequency to a second frequency.

10. The communications apparatus of claim 9 wherein the means for moving the carrier frequency comprises:

a synthesizer for generating a local oscillator signal; and a mixer for mixing the modulated carrier signal at the first preselected frequency with the local oscillator signal for generating a modulated carrier signal at the second frequency, which is shifted from the first preselected frequency.

11. The communications apparatus of claim 10 wherein the carrier frequency is moved in increments of about 300 KHz.

12. The communications apparatus of claim 9 wherein the carrier frequency moving means comprises:

a voltage controlled oscillator for generating a local oscillator signal; and a mixer for mixing the modulated carrier signal at the first preselected frequency with the local oscillator signal for generating a modulated carrier signal at the second frequency, which is shifted from the first preselected frequency.

13. The communications apparatus of claim 12 further comprising a variable resistor for changing the oscillator voltage.

14. The communications apparatus of claim 1 further comprising:

a first receiver having an input impedance for receiving the modulated carrier signal;

a first FM demodulator electrically connected to the first receiver for demodulating the received modulated carrier signal to produce a demodulated carrier signal having a second preselected frequency; and a second coupler connected between the electrical line and the first receiver for matching the input impedance of the first receiver to the characteristic impedance of the electrical line, the second coupler comprising linear phase means for communicating the modulated carrier signal to the first receiver without significant phase distortion.

15. The communications apparatus of claim 14 further comprising:

a wireless remote-control (R/C) transmitter for transmitting data signals to the first receiver, wherein the first receiver further comprises:

an R/C receiver circuit for receiving the R/C transmitter data signals, a second FM modulator for modulating the received R/C transmitter data signals and generating a carrier signal therefor, and a second transmitter for transmitting the carrier signal through the second coupler and over the electrical line.

16. The communications apparatus of claim 15 wherein the R/C transmitter comprises an infrared transmitter.

17. The communications apparatus of claim 15 wherein the R/C transmitter transmits the data signals at about 450 KHz.

18. The communications apparatus of claim 15 wherein the first modulator further comprises means for moving the modulated carrier frequency from the first preselected frequency to a shifted frequency.

19. The communications apparatus of claim 18 wherein the R/C transmitter data signals are transmitted over the electrical line to the first modulator and indicate to the first modulator to shift the carrier frequency.

20. A communications apparatus for a vehicle for communicating frequency modulated (FM) video signals through an electrical line of the vehicle, the electrical line for transmitting an electrical current from a first point of the vehicle to a second point of the vehicle for powering a load connected to the electrical line proximate to the second point, the apparatus comprising:

a modulator for frequency modulating video data to produce a frequency modulated carrier signal having a first preselected frequency;

a transmitter having an output impedance, connected to the modulator, for transmitting the modulated carrier signal from the first point to the second point over the electrical line; and a first coupler connected between the electrical line and the transmitter for matching the output impedance of the transmitter to a characteristic impedance of the electrical line, wherein the first coupler comprises linear phase means for communicating the modulated carrier signal to the electrical line without significant phase distortion.

21. The communications apparatus of claim 20 wherein the vehicle comprises a vehicle selected from the group consisting essentially of an automobile, a truck, a bus, a train, an airplane, a boat, a ship and a submarine.

22. The communications apparatus of claim 20 wherein the modulator further comprises means for moving the modulated carrier frequency from the first preselected frequency to a second frequency.

23. The communications apparatus of claim 22 wherein the carrier frequency moving means comprises:

a synthesizer for generating a local oscillator signal; and a mixer for mixing the modulated carrier signal at the first preselected frequency with the local oscillator signal for generating a modulated carrier signal at the second frequency, which is shifted from the first preselected frequency.

24. The communications apparatus of claim 22 wherein the carrier frequency is moved in increments of about 300 KHz.

25. The communications apparatus of claim 22 wherein the carrier frequency moving means comprises:
   a voltage controlled oscillator for generating a local oscillator signal; and
   a mixer for mixing the modulated carrier signal at the first preselected frequency with the local oscillator signal for generating a modulated carrier signal at the second frequency, which is shifted from the first preselected frequency.

26. The communications apparatus of claim 25 further comprising a variable resistor for changing the oscillator voltage.

27. A system for transmitting frequency modulated (FM) video signals over electrical lines, the electrical lines generally provided for delivering electricity to a plurality of electrical outlets, wherein a first video display device is electrically connected to one of the plurality of electrical outlets, the system comprising:
   a first FM transmitter subsystem comprising:
      a first FM modulator connected to the video display device for receiving video signals therefrom and for frequency modulating the video signals to produce a modulated carrier signal having a first preselected frequency;
      a first transmitter having an output impedance, connected to the first FM modulator, for transmitting the modulated carrier signal; and
   a first coupler connected between the electrical line and the first transmitter for matching the output impedance of the first transmitter to a characteristic impedance of the electrical line, wherein the first coupler comprises linear phase means for communicating the modulated carrier signal to the electrical line without significant phase distortion.

28. The system of claim 27 wherein a second video display device is connected to another one of the plurality of electrical outlets, the system further comprising:
   a first FM receiver subsystem comprising:
      a first receiver having an input impedance for receiving the modulated carrier signal;
      a second coupler connected between the electrical line and the first receiver for matching the input impedance of the first receiver to the characteristic impedance of the electrical line, wherein the second coupler comprises linear phase means for obtaining the modulated carrier signal from the electrical line without significant phase distortion and capacitor means for resonating with the linear phase means at the first preselected frequency; and
      a first FM demodulator connected to the first receiver for demodulating the received modulated carrier signal to provide a second video data signal for display on the second video display device.

29. A communications apparatus for communicating modulated baseband video signals through an electrical line having a characteristic impedance, the apparatus comprising:
   a first modulator for modulating the baseband video data to produce a modulated carrier signal having a first preselected frequency; and
   a first transmitter having an output impedance, connected to the first modulator, for transmitting the modulated carrier signal.

30. The communications apparatus of claim 29 wherein the baseband video signals include a stereo audio signal.

31. A communications apparatus for communicating modulated S-video signals through an electrical line having a characteristic impedance, the apparatus comprising:
   a first modulator for modulating the S-video signals to produce a modulated carrier signal having a first preselected frequency; and
   a first transmitter having an output impedance, connected to the first modulator, for transmitting the modulated carrier signal.

32. A communications apparatus for communicating frequency modulated (FM) baseband video signals through an electrical line having a characteristic impedance, the apparatus comprising:
   a first FM modulator for frequency modulating the baseband video data to produce a frequency modulated carrier signal having a first preselected frequency; and
   a first transmitter having an output impedance, connected to the first FM modulator, for transmitting the modulated carrier signal.

33. A communications apparatus for communicating frequency modulated (FM) S-video signals through an electrical line having a characteristic impedance, the apparatus comprising:
   a first FM modulator for frequency modulating the S-video signals to produce a frequency modulated carrier signal having a first preselected frequency; and
   a first transmitter having an output impedance, connected to the first FM modulator, for transmitting the modulated carrier signal.

34. A communications apparatus for communicating frequency modulated (FM) video signals through an electrical line having a characteristic impedance, the apparatus comprising:
   a first FM modulator for frequency modulating the video data to produce a frequency modulated carrier signal having a first preselected frequency;
   a first transmitter having an output impedance, connected to the first FM modulator, for transmitting the modulated carrier signal;
   a first receiver having an input impedance for receiving the modulated carrier signal;
   a first FM demodulator electrically connected to the first receiver for demodulating the received modulated carrier signal to produce a demodulated carrier signal having a second preselected frequency; and
   a wireless remote-control (R/C) transmitter for transmitting data signals to the first receiver.

35. The apparatus of claim 34 wherein the first receiver further comprises a R/C receiver circuit for receiving the R/C transmitter data signals, a second FM modulator for modulating the received R/C transmitter data signals and generating a carrier signal therefor, and a second transmitter for transmitting the carrier signal over the electrical line.

36. The communications apparatus of claim 34 wherein the R/C transmitter comprises an infrared transmitter.

37. The communications apparatus of claim 34 wherein the R/C transmitter transmits the data signals at about 450 KHz.

38. The communications apparatus of claim 34 wherein the first modulator further comprises means for moving the modulated carrier frequency from the first preselected frequency to a shifted frequency.

39. The communications apparatus of claim 38 wherein the R/C transmitter data signals are transmitted over the electrical line to the first modulator and indicate to the first modulator to shift the carrier frequency.

40. A communications apparatus for communicating MPEG I modulated signals through an electrical line having a characteristic impedance, the apparatus comprising:

a signal processor for converting video data to MPEG I video data;

a first modulator for modulating the MPEG I video data to produce a modulated carrier signal having a first preselected frequency; and a first transmitter having an output impedance, connected to the first modulator, for transmitting the modulated carrier signal.

41. The apparatus of claim 40 wherein the first modulator further comprises means for moving the modulated carrier frequency from the first preselected frequency to a shifted frequency.

42. A communications apparatus for communicating MPEG II modulated signals through an electrical line having a characteristic impedance, the apparatus comprising:

a signal processor for converting video data to MPEG II video data;

a first modulator for modulating the MPEG II video data to produce a modulated carrier signal having a first preselected frequency; and a first transmitter having an output impedance, connected to the first modulator, for transmitting the modulated carrier signal.

43. The apparatus of claim 42 wherein the first modulator further comprises means for moving the modulated carrier frequency from the first preselected frequency to a shifted frequency.

44. A communications apparatus for communicating frequency modulated stereo audio signals through an electrical line, the apparatus comprising:

a first modulator for modulating the stereo audio signals to produce a modulated carrier signal having a first preselected frequency; and a first transmitter having an output impedance, connected to the first modulator, for transmitting the modulated carrier signal.

45. The communications apparatus of claim 44 further comprising:

a first receiver connected to the electrical line which receives the transmitted modulated carrier signal; and a first demodulator connected to the receiver for demodulating the modulated carrier signals to reproduce the stereo audio signals.

* * * * *